(12) United States Patent
Seo et al.

(10) Patent No.: US 10,333,108 B2
(45) Date of Patent: *Jun. 25, 2019

(54) LIGHT EMITTING DEVICE

(71) Applicant: Semiconductor Energy Laboratory Co., Ltd., Kanagawa-ken (JP)

(72) Inventors: Satoshi Seo, Kanagawa (JP); Takeshi Noda, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/896,588

(22) Filed: Feb. 14, 2018

(65) Prior Publication Data

US 2018/0175330 A1 Jun. 21, 2018

Related U.S. Application Data

(63) Continuation of application No. 13/205,872, filed on Aug. 9, 2011, now Pat. No. 9,905,809, which is a
(Continued)

(30) Foreign Application Priority Data

Jan. 21, 2005 (JP) .................. 2005-013688

(51) Int. Cl.
*H01L 27/32* (2006.01)
*H01L 51/52* (2006.01)
*H01L 51/50* (2006.01)

(52) U.S. Cl.
CPC ...... *H01L 51/5278* (2013.01); *H01L 51/5044* (2013.01); *H01L 51/5218* (2013.01);
(Continued)

(58) Field of Classification Search
CPC .................................................. H01L 51/5278
See application file for complete search history.

(56) References Cited

U.S. PATENT DOCUMENTS

| | | |
|---|---|---|
| 5,294,870 A | 3/1994 | Tang et al. |
| 5,670,792 A | 9/1997 | Utsugi et al. |

(Continued)

FOREIGN PATENT DOCUMENTS

| | | |
|---|---|---|
| CN | 001327360 A | 12/2001 |
| CN | 001426269 A | 6/2003 |

(Continued)

OTHER PUBLICATIONS

Nakada, T. et al., "27a-ZL-12 Multi Photon Emission Organic EL Devices Using Charge-Transfer Complex as Charge Generation Layer," 63rd Applied Physics-Related Combined Seminar Seminar Proceedings, Sep. 24, 2002, p. 1165, JSAP (The Japan Society of Applied Physics).
(Continued)

*Primary Examiner* — Eugene Lee
(74) *Attorney, Agent, or Firm* — Husch Blackwell LLP

(57) ABSTRACT

It is an object of the invention to provide a light emitting device which can display a superior image in which luminescent color from each light emitting layer is beautifully displayed and power consumption is lowered in a light emitting element in which light emitting layers are stacked. One feature of the invention is that, in a light emitting element which comprises light emitting layers stacked between electrodes, each distance between each light emitting layer and an electrode is odd multiples of quarter wavelength with a range of plus or minus 10% thereof by controlling a thickness of a layer provided therebetween to enhance luminous output efficiency. Another feature of the invention is that a drive voltage is lowered using a high
(Continued)

conductive material for the layer compared with a conventional element.

10 Claims, 17 Drawing Sheets

Related U.S. Application Data continuation of application No. 10/590,041, filed as application No. PCT/JP2006/300921 on Jan. 17, 2006, now abandoned.

(52) U.S. Cl.
CPC ...... *H01L 51/5265* (2013.01); *H01L 27/3211* (2013.01); *H01L 27/3244* (2013.01)

(56) References Cited

U.S. PATENT DOCUMENTS

| | | | |
|---|---|---|---|
| 5,757,026 A | 5/1998 | Forrest et al. | |
| 5,834,893 A | 11/1998 | Bulovic et al. | |
| 5,837,391 A | 11/1998 | Utsugi | |
| 6,013,384 A | 1/2000 | Kido et al. | |
| 6,091,195 A | 7/2000 | Forrest et al. | |
| 6,111,274 A | 8/2000 | Arai | |
| 6,284,393 B1* | 9/2001 | Hosokawa | H05B 33/28 257/91 |
| 6,384,529 B2 | 5/2002 | Tang et al. | |
| 6,392,340 B2 | 5/2002 | Yoneda et al. | |
| 6,454,966 B1 | 9/2002 | Kobayashi et al. | |
| 6,466,354 B1 | 10/2002 | Gudeman | |
| 6,541,130 B2 | 4/2003 | Fukuda | |
| 6,573,650 B2 | 6/2003 | Aoki et al. | |
| 6,589,673 B1 | 7/2003 | Kido et al. | |
| 6,650,047 B2 | 11/2003 | Aoki et al. | |
| 6,747,618 B2 | 6/2004 | Arnold et al. | |
| 6,936,961 B2 | 8/2005 | Liao et al. | |
| 6,969,948 B2 | 11/2005 | Urabe et al. | |
| 6,971,938 B2 | 12/2005 | Urabe et al. | |
| 7,102,282 B1 | 9/2006 | Yamada et al. | |
| 7,122,845 B2 | 10/2006 | Uchida | |
| 7,173,373 B2 | 2/2007 | Yamada et al. | |
| 7,189,994 B2 | 3/2007 | Arao | |
| 7,227,304 B2 | 6/2007 | Tsujimura et al. | |
| 7,306,978 B2 | 12/2007 | Yamazaki et al. | |
| 7,323,225 B2 | 1/2008 | Aoki et al. | |
| 7,365,488 B2 | 4/2008 | Lee et al. | |
| 7,508,127 B2 | 3/2009 | Miura et al. | |
| 7,579,203 B2 | 8/2009 | Yamazaki et al. | |
| 7,585,783 B2 | 9/2009 | Nakamura et al. | |
| 7,598,670 B2 | 10/2009 | Kumaki et al. | |
| 7,615,921 B2 | 11/2009 | Kimura | |
| 7,940,002 B2 | 5/2011 | Kumaki et al. | |
| 8,080,934 B2 | 12/2011 | Kido et al. | |
| 9,905,809 B2* | 2/2018 | Seo | H01L 51/5218 |
| 2001/0043043 A1 | 11/2001 | Aoyama et al. | |
| 2002/0024051 A1 | 2/2002 | Yamazaki et al. | |
| 2003/0044639 A1 | 3/2003 | Fukuda | |
| 2003/0132434 A1 | 7/2003 | Hirano | |
| 2003/0189401 A1 | 10/2003 | Kido et al. | |
| 2003/0218166 A1 | 11/2003 | Tsutsui | |
| 2003/0234609 A1 | 12/2003 | Aziz et al. | |
| 2005/0062057 A1 | 3/2005 | Yamazaki et al. | |
| 2005/0088080 A1* | 4/2005 | Cheng | H01L 51/5092 313/504 |
| 2005/0098207 A1 | 5/2005 | Matsumoto et al. | |
| 2005/0249974 A1 | 11/2005 | Mori et al. | |
| 2006/0033425 A1 | 2/2006 | Miura et al. | |
| 2007/0102737 A1 | 5/2007 | Kashiwabara et al. | |
| 2007/0131948 A1 | 6/2007 | Seo et al. | |
| 2009/0314203 A1 | 12/2009 | Nakamura et al. | |
| 2011/0272690 A1 | 11/2011 | Kumaki et al. | |
| 2012/0132895 A1 | 5/2012 | Kido et al. | |

FOREIGN PATENT DOCUMENTS

| | | |
|---|---|---|
| EP | 0 855 848 A2 | 7/1998 |
| EP | 1 052 708 A2 | 11/2000 |
| EP | 1 089 361 A2 | 4/2001 |
| EP | 1 128 438 A1 | 8/2001 |
| EP | 1 154 676 A1 | 11/2001 |
| EP | 1 351 558 A1 | 10/2003 |
| EP | 1 391 918 A2 | 2/2004 |
| EP | 1 478 025 A2 | 11/2004 |
| EP | 1 530 245 A2 | 5/2005 |
| JP | 61-202420 A | 9/1986 |
| JP | 10-270172 A | 10/1998 |
| JP | 2000-323277 A | 11/2000 |
| JP | 2001-196175 A | 7/2001 |
| JP | 2001-244079 A | 9/2001 |
| JP | 2002-056973 A | 2/2002 |
| JP | 2003-045661 A | 2/2003 |
| JP | 2003-142277 A | 5/2003 |
| JP | 2003-204161 A | 7/2003 |
| JP | 2003-264083 A | 9/2003 |
| JP | 2003-272855 A | 9/2003 |
| JP | 2003-272860 A | 9/2003 |
| JP | 2004-079538 A | 3/2004 |
| JP | 2004-119201 A | 4/2004 |
| JP | 2004-153255 A | 5/2004 |
| JP | 2004-241194 A | 8/2004 |
| JP | 2004-247137 A | 9/2004 |
| JP | 2004-342614 A | 12/2004 |
| JP | 2004-355975 A | 12/2004 |
| JP | 2005-093396 A | 4/2005 |
| JP | 2005-093399 A | 4/2005 |
| JP | 2005-093401 A | 4/2005 |
| JP | 2005-156871 A | 6/2005 |
| JP | 2005-166637 A | 6/2005 |
| JP | 2005-302313 A | 10/2005 |
| JP | 2005-322435 A | 11/2005 |
| KR | 2003-0077476 A | 10/2003 |
| WO | WO 2001/015244 A1 | 3/2001 |
| WO | WO 2004/097915 A1 | 11/2004 |

OTHER PUBLICATIONS

Matsumoto, T. et al, "Multiphoton Emission OLED: Structure and Property," IDW '03, Proceedings of the 10th International Display Workshops, 2003, pp. 1285-1288.

"2.3 Problems to be Solved by Multi-Photon Structure," Organic Electroluminescence Materials and Technologies, May 31, 2004, pp. 35-37, CMC Publishing.

International Search Report re application No. PCT/JP2006/300921, dated Mar. 7, 2006.

Written Opinion of the International Searching Authority re application No. PCT/JP2006/300921, dated Mar. 7, 2006.

European Search Report re application No. EP 06712137.6, dated Dec. 8, 2009.

Korean Office Action re Application No. KR 2007-7019078, dated Jun. 23, 2012.

* cited by examiner

LIGHT EMITTING DEVICE

This application is a continuation of application Ser. No. 13/205,872 filed on Aug. 9, 2011 which is a continuation of application Ser. No. 10/590,041 filed on Aug. 18, 2006 (now abandoned) which is the U.S. national stage of PCT/JP2006/300921 filed Jan. 17, 2006 which are all incorporated herein by reference.

TECHNICAL FIELD

The present invention relates to a light emitting device which can be utilized as a display means, a light source, or the like.

BACKGROUND ART

A display device including a light emitting element (hereinafter, referred to as a light emitting device) has a wider viewing angle and a higher response characteristic and operates with lower power consumption compared with a display device having a liquid crystal element, namely a liquid crystal display device. Therefore, the light emitting device has been actively developed.

A light emitting element includes an organic material or an inorganic material between a pair of electrodes. By applying current to the organic material or inorganic material and exciting a light emitting material, a predetermined luminescent color can be obtained. To increase emission luminance of the light emitting element, a large amount of current may be supplied, in other words, high voltage may be applied to the pair of electrodes; therefore, the advantage of low power consumption cannot be attained. In addition, deterioration of the light emitting element may be accelerated by applying a large amount of current.

Hence, a light emitting element in which emission luminance is, increased by stacking a plurality of light emitting elements and applying current that has the same current density as a single layer is proposed (refer to Patent Document 1: Japanese Patent Laid-Open No. 2003-272860). By utilizing this light emitting element, a predetermined luminance can be obtained by a light emitting element having a stacked-layer structure even if current that has less than half the current density of a single layer is applied. For example, it is said that n times luminance can be accomplished without increasing current density if n light emitting units having the same structure existing between electrodes are provided. At this time, it is mentioned that drive voltage also becomes n times or more; however, there is a great advantage that n times luminance can be obtained without sacrificing lifetime.

DISCLOSURE OF INVENTION

The above Patent Document 1 discloses all optical film thicknesses from each emission position to a reflective electrode are set to be approximately oddly multiplied ¼ wavelength since a plurality of emission positions separately exists. Embodiment 5 in Patent Document 1 discloses an optical distance from a blue emission position to a reflective electrode is controlled intentionally by adjusting a thickness of a hole transporting layer including α-NPD of a light emitting unit in a light emitting element with a blue light emitting unit and a red light emitting unit.

The characteristics of a hole transporting layer such as α-NPD is closer to that of a light emitting layer as compared to a hole injecting layer and the hole transporting layer with low conductivity; therefore, a structure of increasing thickness of the hole transporting layer is not preferable since drive voltage is increased if the thickness of the hole transporting layer is increased.

The distance with which the luminous output efficiency not being lowered is different depending on an emission wavelength; therefore, the film thicknesses of α-NPD in light emitting units are required to be differentiated from each other in a light emitting element. Therefore, luminous output efficiency of the whole light emitting element is not enhanced only by differentiating film thicknesses of α-NPD in a blue light emitting unit. Further, according to Patent Document 1, when film thickness of α-NPD in a red light emitting unit is differentiated from film thicknesses in the other units, a film thickness of the whole light emitting element is increased and a drive voltage is increased. By increasing drive voltage, a problem of increasing power consumption of a light emitting device is lessened.

Further, luminous efficiency is different according to each luminescent color. To take a balance of luminance in the whole emission of a light emitting device, it is required to apply a large amount of current for a light emitting element with inferior luminous efficiency; therefore, there is a disadvantage that deterioration of a light emitting element is accelerated.

It is an object of the invention to reduce power consumption of a light emitting device. It is another object of the invention to reduce deterioration because of luminance change of a pixel in a light emitting device. It is another object of the invention to provide a light emitting device and a manufacturing method of the light emitting device, which can display a superior image in which beautiful luminescent color from each light emitting layer is displayed and which operates with low power consumption in a light emitting element in which light emitting layers are stacked.

In view of the foregoing problems, one feature of the present invention is that, in a light emitting element which comprises light emitting layers stacked between electrodes, an optical distance (hereinafter, referred to as a distance) from each light emitting layer to an electrode is controlled. Specifically, one feature of the invention is that the distance between a reflective electrode and each light emitting layer is controlled by a thickness of a layer provided therebetween, respectively, to enhance luminous output efficiency.

Another feature of the invention is to form a pixel portion having a light emitting element in which light emitting layers are stacked and a light emitting element in which a light emitting layer is single. For example, a light emitting element having a problem of low emission luminance is formed by stacking light emitting layers, and another light emitting element is formed with one light emitting layer.

A specific mode of the invention is a light emitting device in which a plurality of light emitting layers are stacked between a first electrode and a second electrode that face each other, and a distance from each of the plurality of light emitting layers to the first electrode is approximately odd multiples of quarter wavelength $(2m-1)\lambda/4$ (m: natural number) by controlling a thickness of a layer provided between each light emitting layer and the first electrode so that luminous output efficiency is enhanced. Note that it may not be possible to be just odd multiples of quarter wavelength because of film formation accuracy in some cases; therefore, "approximately" is used here. The invention comprises the range of odd multiples of quarter wavelength to be plus or minus 10% thereof when reciting approximately odd multiples of quarter wavelength.

Another mode of the invention is a light emitting device in which a plurality of light emitting layers are stacked between a first electrode and a second electrode that face each other, each light emitted from the plurality of light emitting layers has a different color, and a distance from each of the plurality of light emitting layers to the first electrode is odd multiples of quarter wavelength with a range of plus or minus 10% thereof by controlling a thickness of a layer provided between the light emitting layer and the first electrode and in contact with each of the plurality of light emitting layers so that luminous output efficiency is enhanced.

Another mode of the invention is a light emitting device including a stacked layer type light emitting element in which a plurality of light emitting layers is stacked between a first electrode and a second electrode that face each other and a single-layer type light emitting element having one light emitting layer between a first electrode and a second electrode, in which a distance from each of the plurality of light emitting layers to the first electrode is odd multiples of quarter wavelength with a range of plus or minus 10% thereof by controlling a thickness of a layer provided between the light emitting layer and the first electrode in the stacked layer type light emitting element so that luminous output efficiency is enhanced.

Another mode of the invention is a light emitting device including a stacked layer type light emitting element in which a plurality of light emitting layers are stacked between a first electrode and a second electrode that face each other and a single-layer type light emitting element having one light emitting layer between a first electrode and a second electrode, in which each light emitted from the plurality of light emitting layers in the stacked layer type light emitting element has different color, and the distance from each of the plurality of light emitting layers to the first electrode is odd multiples of quarter wavelength with a range of plus or minus 10% thereof by controlling a thickness of a layer which is provided between the light emitting layer and the first electrode and which is in contact with each of the plurality of light emitting layers in the light emitting element so that luminous output efficiency is enhanced.

One feature of the invention is that a highly conductive material is used for a layer for control so that luminous output efficiency is enhanced and the distance from a reflective electrode to a light emitting layer is odd multiples of quarter wavelength with a range of plus or minus 10% thereof by controlling a thickness of the first layer. A film which determines a distance is formed from a highly conductive material in the light emitting element according to the invention; therefore, drive voltage can be lowered compared with the above Patent Document 1.

In the invention, a material which exhibits emission from a triplet excited state or a material which exhibits emission from a singlet excited state can be included in a light emitting layer. Therefore, emission in which emission from a triplet excited state and emission from a singlet excited state are included can be obtained by the stacked light emitting layers. Obviously, only emission from a triplet excited state or only emission from a singlet excited state can be obtained from the stacked light emitting layers.

It is to be noted that a light emitting element including the stacked light emitting layers can be referred to as a light emitting element including n light emitting layers between electrodes by using a natural number n.

According to the invention, luminance obtained when the same amount of current is supplied can be increased compared with a light emitting element having a light emitting layer of a single layer. In other words, the amount of current for obtaining the same luminance, which flows between electrodes, can be lowered.

BEST MODE FOR CARRYING OUT THE INVENTION

Figure 1:
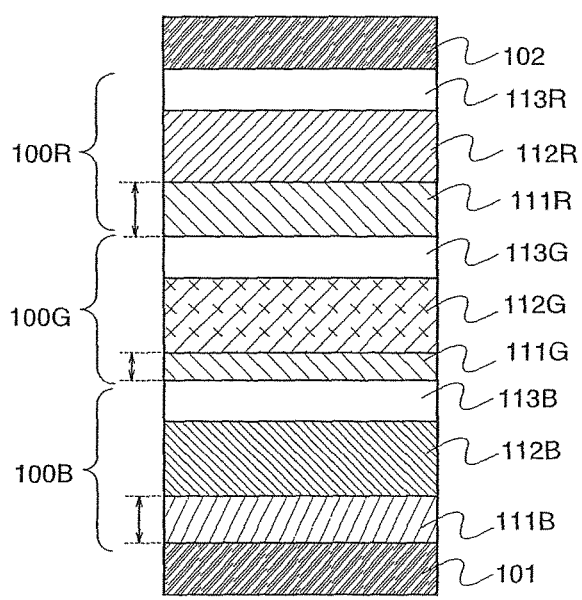
FIG. 1 is a view showing a light emitting element according to the present invention.

Embodiment modes according to the present invention are described in detail with reference to the drawings. However, it is easily understood by those who are skilled in the art that embodiments and details herein disclosed can be modified in various ways without departing from the purpose and the scope of the present invention. Therefore, it should be noted that the description of embodiment modes set forth below should not be interpreted as limiting the present invention. Note that the same reference numerals are given to the same portions or the portions having the same function in all drawings, and the description thereof is not repeated.

(Embodiment Mode 1)

In this embodiment mode, a structure of a light emitting element in which light emitting units are stacked is explained.

FIG. 1 shows a light emitting element in which a first light emitting unit 100B, a second light emitting unit 100G, and a third light emitting unit 100R are sequentially stacked between a first electrode 101 and a second electrode 102. The colors of light emitted from the light emitting units 100B, 100G, and 100R are not limited in particular. In this embodiment mode, however, a case where the first light emitting unit exhibits blue emission, the second light emitting unit exhibits green emission, and the third light emitting unit exhibits red emission is explained. The light emitting element in which light emitting units are stacked indicates a state where two or more light emitting units are stacked. In this embodiment mode, a state where three light emitting units are stacked is explained; however, the present invention is not limited to this.

In the light emitting element shown in FIG. 1, the first electrode 101 is formed from a material having high reflectivity and the second electrode 102 is formed from a material having a high light-transmitting property to extract light from the second electrode 102. The light emitting unit 100R includes a first layer 111R, a second layer 112R, and a third layer 113R; the light emitting unit 100G includes a first layer 111G, a second layer 112G, and a third layer 113G; and the light emitting unit 100B includes a first layer 111B, a second layer 112B, and a third layer 113B.

Each of the light emitting units has a feature that a distance from the first electrode 101 to the second layer 112 (112B, 112G and 112R) in each light emitting unit is odd multiples of quarter wavelength with a range of plus or minus 10% thereof by controlling a thickness of the first layer 111 (111B, 111G and 111R) in the case of using each of the second layers 112 as a layer including a light emitting layer. In other words, each of the light emitting elements has a feature that a distance between the first electrode 101 and the light emitting layer is odd multiples of quarter wavelength with a range of plus or minus 10% thereof by controlling a thickness of a layer provided therebetween. Therefore, the thicknesses of the first layers 111R, 111G, and 111B are different in each light emitting unit.

The distances from the first electrode 101 to the respective light emitting layers are different from one another since the light emitting units are stacked so that luminous output efficiency is enhanced. Therefore, a light emitting element in which the thicknesses of the first layers 111 provided between the first electrode 101 and each light emitting layer are controlled respectively is provided. As a result, a state where luminous output efficiency is high can be provided.

As described above, luminous efficiency can be enhanced by stacking light emitting units; therefore, an amount of current flow can be kept low to obtain the same luminous and the lifetime of the light emitting element can be improved.

In this embodiment mode, a mode in which the thicknesses of all the first layers 111R, 111G, and 111B are controlled is shown. However, according to the invention, a thickness of any one of the first layers 111 included in a light emitting element, in which light emitting units are stacked, may be controlled. By controlling any one of the first layers 111, a state where luminous output efficiency is high can be provided and an effect that an amount of current flow is kept low can be obtained.

In this invention, the light emitting element in which light emitting units are stacked is not required to include light emitting layers each of which exhibits different luminescent colors. In other words, according to the invention, layers which exhibit the same luminescent color may be stacked. This is because a state where luminous efficiency is high can be provided even if layers which exhibit the same luminescent colors are stacked, and an effect that an amount of current flow is kept low can be obtained.

According to the invention, the first layer 111 is formed from a highly conductive material and a thickness of the first layer 111 is controlled; therefore, drive voltage can be lowered compared with a conventional element mentioned in Patent Document 1 and the like.

The first to third layers 111 to 113 (113B, 113G and 113R) can be formed by a sputtering method, a vapor deposition method, or the like.

Next, the electrodes will be explained. The first electrode 101 is formed from a material having high reflectivity and the second electrode 102 is formed from a material having a light-transmitting property. The light-transmitting property can be also obtained by forming a quite thin film using a material having no light-transmitting property.

As a material for the first electrode 101, a metal material such as titanium (Ti), aluminum (Al), gold (Au), platinum (Pt), nickel (Ni), tungsten (W), chromium (Cr), molybdenum (Mo), iron (Fe), cobalt (Co), copper (Cu), or palladium (Pd) can be used, and a single layer or a stacked layer of the above metal material can be used. The first electrode 101 can be formed, for example, by a sputtering method, a vapor deposition method, or the like.

The second electrode 102 can be formed from a light-transmitting material such as indium tin oxide (ITO), indium tin oxide containing silicon oxide, or indium oxide containing 2 to 20% of zinc oxide. In addition, it is possible to use a thin film formed from a metal material having no light-transmitting property such as gold (Au), platinum (Pt), nickel (Ni), tungsten (W), chromium (Cr), molybdenum (Mo), iron (Fe), cobalt (Co), copper (Cu), or palladium (Pd) so as to have a light-transmitting property. As for the second electrode 102, a single layer or a stacked layer of the above metal materials can be used. In the case of using a stacked-layer structure, a structure in which the metal material having no light-transmitting property is thinly formed and a light-transmitting material is stacked thereover can be used. In order to prevent the resistance from being increased due to the formation of the thin second electrode 102, an auxiliary wiring can be provided.

The first electrode 101 or second electrode 102 may be an anode or a cathode, respectively, depending on voltage which is applied to the light emitting element.

It is preferable to use a material having a high work function (work function of 4.0 eV or more) in the case of an anode, and a material having a low work function (work function of 3.8 eV or less) in the case of a cathode.

The first electrode 101 or second electrode 102 can be formed by a sputtering method, a vapor deposition method, or the like. In the case of using a vapor deposition method, the first electrode 101, the first to third layers 111 to 113, and the second electrode 102 can be formed continuously without being exposed to the air. Impurity mixing into interfaces and the like can be reduced by forming the light emitting element continuously without being exposed to the air in this way.

The light emitting element according to the invention controls the thickness of the first layer 111 provided between each light emitting layer and the first electrode 101, and thus, a state where luminous output efficiency is high can be obtained. Further, according to the invention, luminous efficiency at the same current density can be enhanced by stacking the light emitting element; therefore, density of current flow can be kept low and the lifetime of the light emitting element can be improved.

As described above, a light emitting device having a light emitting element in which light emitting units are stacked can display an image which is clear and superior in image quality, and low power consumption can be attained.

(Embodiment Mode 2)

In this embodiment mode, a structure of a light emitting element which is different from that in the above-described embodiment mode is explained.

According to the present invention, a light emitting element in which light emitting units are stacked is not required to be applied to all light emitting elements formed over a substrate. A distance from each of the light emitting layers to a first electrode 101 can be odd multiples of quarter wavelength with a range of plus or minus 10% thereof by controlling a thickness of a first layer 111 for at least one light emitting element, and accordingly, a state where luminous output efficiency is high can be obtained, luminous efficiency at the same current density can be enhanced, and density of current which is applied can be kept low. As a result of keeping current density low, the lifetime of the light emitting element can be improved. In this embodiment mode, a case where one light emitting element, which exhibits one luminescent color, is a light emitting element in which light emitting units are stacked is explained.

Figure 2:
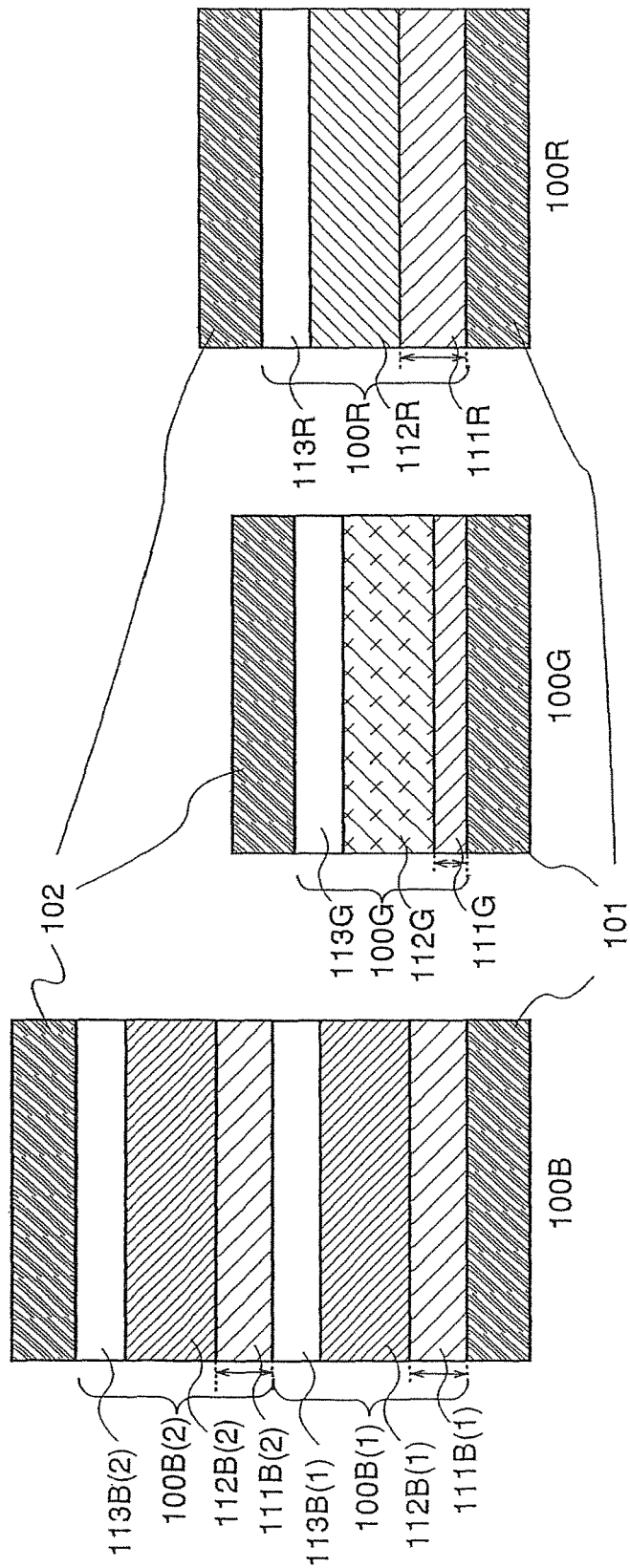
FIG. 2 is a view showing a light emitting element according to the invention.

FIG. 2 shows a state where a first light emitting element 100B, a second light emitting element 100G, and a third light emitting element 100R are provided over the same substrate. The colors of light emitted from the light emitting elements 100B, 100G, and 100R are not limited in particular. In this embodiment mode, however, a case where the first light emitting element exhibits blue emission, the second light emitting element exhibits green emission, and the third light emitting element exhibits red emission, is explained.

A light emitting element in which light emitting units 100B (1) and 100B (2) are stacked is used for the light emitting element which exhibits blue emission. A light emitting element in which light emitting units are stacked as described above is expediently referred to as a stacked layer type light emitting element. Further, light emitting elements each including one light emitting unit are used for the light emitting elements 100R and 100G which exhibit red emission or green emission, respectively, and are expediently referred to as single-layer type light emitting elements.

The structures of the first electrode 101 and the second electrode 102 are similar to that in the above-described Embodiment Mode 1; therefore, the explanation is omitted.

In such a stacked layer type light emitting element, the distance from a light emitting layer to the first electrode 101 is odd multiples of quarter wavelength with a range of plus or minus 10% thereof by controlling a thickness of the first layer 111 (111B(1) and 111B(2)). As a result, luminous output efficiency is enhanced and current density can be kept low. By keeping current density low, the lifetime of the stacked layer type light emitting element can be improved. A second layer 112 (112B(1) and 112B(2)) and a third layer 113 (113B(1) and 113B(2)) are included in each of the light emitting units.

As described above, luminous efficiency can be enhanced by the stacked layer type light emitting element; therefore, density of current flow can be kept low and the lifetime can be improved. Therefore, it is desirable to selectively apply the stacked layer type light emitting element to a light emitting element which is easily deteriorated.

Also in a single-layer type light emitting element, the distance from a light emitting layer to a first electrode 101 can be odd multiples of quarter wavelength with a range of plus or minus 10% thereof by controlling a thickness of a first layer 111 (111G and 111R). As a result, luminous output efficiency can be enhanced. A second layer 112 (112G and 112R) and a third layer 113 (113G and 113R) are included in each of the light emitting units.

In the stacked layer type light emitting element and single-layer type light emitting element, the first layer 111 (111B(1), 111B(2), 111G and 111R) is formed from a highly conductive material and a thickness of the first layer 111 is controlled; therefore, drive voltage can be lowered compared with a conventional element mentioned in Patent Document 1 and the like.

As described above, a light emitting device in which a stacked layer type light emitting element is used for at least one light emitting element, which exhibits one luminescent color, can display an image that is clear and superior in image quality, and low power consumption can be attained.

(Embodiment Mode 3)

In this embodiment mode, a case where a stacked layer type light emitting element is applied to a light emitting element which exhibits different luminescent color from that in the above embodiment mode is explained.

In the present invention, a stacked layer type light emitting element may be used for an element except a first light emitting element 100B. For example, a single layer type light emitting element may be used as a light emitting element 100G which exhibits luminescent color with high sensitivity with respect to human eyes, such as green emission, and accordingly, the light emitting element 100G may have a structure in which the number of light emitting layers included between a pair of electrodes is smaller than that of the stacked layer type light emitting elements 100R and 100B which exhibit red emission or blue emission, respectively.

The explanation of another structure is omitted since it is similar to the above embodiment mode.

In the stacked layer type light emitting element, a distance from a light emitting layer to a first electrode 101 is odd multiples of quarter wavelength with a range of plus or minus 10% thereof by controlling a thickness of a first layer 111. As a result, luminous output efficiency is enhanced and current density can be kept low. By keeping current density low, the lifetime of the stacked layer type light emitting element can be improved.

Also in a single-layer type light emitting element, a distance from a light emitting layer to a first electrode 101 can be odd multiples of quarter wavelength with a range of plus or minus 10% thereof by controlling a thickness of a first layer 111. As a result, luminous output efficiency can be enhanced.

As described above, by differentiating the number of the light emitting layers provided between the pair of electrodes in a light emitting element that exhibits luminescent color with low sensitivity with respect to human eyes and in a light emitting element that exhibits luminescent color with high sensitivity with respect to human eyes, luminance of each color can be harmonized efficiently.

In the stacked layer type light emitting element and the single-layer type light emitting element, the first layer 111 is formed from a highly conductive material and a thickness of the first layer 111 is controlled; therefore, drive voltage can be lowered compared with a conventional element mentioned in Patent Document 1 and the like.

As described above, a light emitting device in which a stacked layer type light emitting element is used for at least one light emitting element that exhibits luminescent color can display an image that is clear and superior in image quality, and low power consumption can be attained.

(Embodiment Mode 4)

In this embodiment mode, a structure and a material of each light emitting element are explained.

Figure 3:
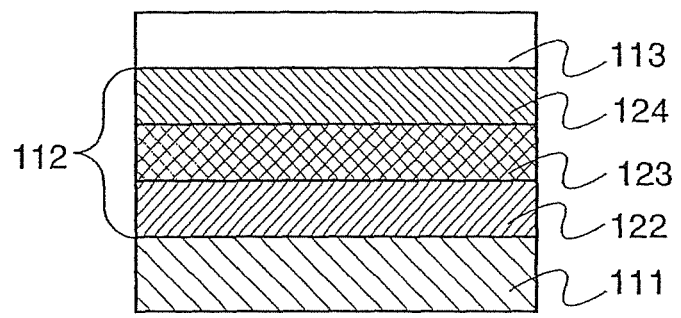
FIG. 3 is a view showing a light emitting element according to the invention.

As shown in FIG. 3, a light emitting unit includes a first layer 111, a second layer 112, and a third layer 113 which are stacked sequentially from a first electrode 101.

When voltage is applied to this light emitting element, which has the light emitting unit, so that the electric potential of the first electrode 101 is higher than the electric potential of a second electrode 102, holes are injected from the first layer 111 into the second layer 112 and electrons are injected from the third layer 113 into the second layer 112. Then, holes and electrons are recombined in the second layer 112 and a light emitting material is made to be in an excited state, and accordingly, luminescence is produced when the light emitting material in the excited state returns to the ground state.

The material of the first to third layers 111 to 113 will be explained.

The first layer 111 is a layer which generates holes. This function can be achieved by using a layer including a hole transporting material and a material which exhibits an electron accepting property to the hole transporting material. In addition, it is preferable that the material which exhibits an electron accepting property to the hole transporting material be included so that the molar ratio is 0.5 to 2 (=the material which exhibits an electron accepting property to the hole transporting material/the hole transporting material) with respect to the hole transporting material.

The hole transporting material is a material in which a transporting property of holes is higher than that of electrons, and for example, organic compounds such as aromatic amine compounds such as 4,4'-bis[N-(1-naphthyl)-N-phenylamino] biphenyl (abbreviation: α-NPD), 4,4'-bis[N-(3-methylphenyl)-N-phenylamino] biphenyl (abbreviation: TPD), 4,4',4''-tris(N,N-diphenylamino) triphenylamine (abbreviation: TDATA), 4,4',4''-tris[N-(3-methylphenyl)-N-phenylamino] triphenylamine (abbreviation: MTDATA), and 4,4'-bis[N-{4-(N,N-di-m-tolylamino)phenyl}-N-phenylamino] biphenyl (abbreviation: DNTPD); or phthalocyanine compounds such as phthalocyanine (abbreviation: $H_2Pc$), copper phthalocyanine (abbreviation: CuPc), and vanadyl phthalocyanine (abbreviation: VOPc) can be used. It is to be noted that the hole transporting material is not limited thereto.

In addition, for example, an oxide of metal belonging to any one of Group 4 to 12 in the periodic table (a metal oxide) can be used as the material which exhibits an electron accepting property to the hole transporting material. Among others, an oxide of metal belonging to any one of Groups 4 to 8 in the periodic table often has a high electron accepting property, and a vanadium oxide, a molybdenum oxide, a niobium oxide, a rhenium oxide, a tungsten oxide, a ruthenium oxide, a titanium oxide, a chromium oxide, a zirconium oxide, a hafnium oxide, and a tantalum oxide are particularly preferable. Besides the oxides, nitrides and oxynitrides of the metals mentioned above may be used. It is to be noted that the material which exhibits an electron accepting property to the hole transporting material is not limited thereto, and iron trichloride ($FeCl_3$), aluminum trichloride ($AlCl_3$), or 7,7,8,8-tetracyano-2,3,5,6-tetrafluoro-quinodimethane (abbreviation: $F_4TCNQ$) may be used.

As described above, the first layer 111 includes a mixed layer of a hole transporting material comprising an organic compound and a material which exhibits an electron accepting property to the hole transporting material and which comprising the above metal oxide. It is to be noted that the mixed layer includes a layer in which an organic compound and an inorganic compound are mixed or a layer in which each of an organic compound and an inorganic compound are thinly formed.

By using this mixed layer of an organic compound and an inorganic compound, crystallization of the organic compound can be suppressed and the first layer 111 can be thickly formed without increasing resistance. Further, the mixed layer of an organic compound and a material which exhibits an electron accepting property to the hole transporting material and which is formed from the above metal oxide has high conductivity; therefore, a film can be thickened without increasing resistance. Hence, even if there is a depression/projection due to dust, dirt, or the like over the first electrode 101, the depression/projection hardly has impacts since the first layer 111 is thickly formed. Therefore, failure, such as a short circuit between the first electrode 101 and the second electrode 102 due to a depression/projection, can be prevented. Further, the first electrode 101 and the second layer 112 can be separated from each other by forming the first layer 111 thickly; therefore, quenching of emission due to metal can be prevented.

It is to be noted that the first layer 111 may include another organic compound. As another organic compound, rubrene and the like are given. Reliability can be enhanced by adding rubrene.

This first layer 111 can be formed by a vapor deposition method. When a mixed layer of a plurality of compounds is formed as the first layer 111, a co-evaporation method can be used. The co-evaporation method includes a co-evaporation method by resistance-heating evaporation, a co-evaporation method by electron-beam evaporation, and a co-evaporation method by resistance-heating evaporation and electron-beam evaporation. In addition, the first layer 111 may be formed by combining the same type of methods or different types of methods, for example, deposition by resistance-heating evaporation and sputtering, and deposition by electron-beam evaporation and sputtering. The example described above shows a layer including two kinds of materials. However, when three or more kinds of materials are included, the first layer 111 may be similarly formed by combining the same type of methods or different types of methods.

Next, the second layer 112, which is a layer including a light emitting layer, is explained. The layer including the light emitting layer may be a single layer formed of only the light emitting layer or a multilayer including the light emitting layer. To cite a case, a specific multilayer includes a light emitting layer and additionally an electron transporting layer and/or a hole transporting layer. FIG. 3 shows a case of a multilayer in which the second layer 112 includes a hole transporting layer 122, a light emitting layer 123, and an electron transporting layer 124.

The hole transporting layer 122 can be formed from a known material. Typical examples include aromatic amine-based compounds, and for example, star burst aromatic amine compounds such as 4,4'-bis[N-(1-naphthyl)-N-phenyl-amino]-biphenyl (hereinafter, referred to as α-NPD), 4,4',4''-tris(N,N-diphenyl-amino)-triphenylamine (hereinafter, referred to as TDATA), and 4,4',4''-tris[N-(3-methylphenyl)-N-phenyl-amino]-triphenylamine (hereinafter, referred to as MTDATA) are given.

It is preferable that the light emitting layer 123 be a layer including a light emitting material dispersed in a layer formed from a material having larger energy gap than that of the light emitting material. It is to be noted that the energy gap indicates the energy gap between the LUMO level and the HOMO level. In addition, a material which provides a favorable luminous efficiency and is capable of producing luminescence of a desired emission wavelength may be used for the light emitting material.

For the material which is used for dispersing the light emitting material, for example, anthracene derivatives such as 9,10-di(2-naphthyl)-2-tert-butylanthracene (abbreviation: t-BuDNA); carbazole derivatives such as 4,4'-bis(N-carbazolyl) biphenyl (abbreviation: CBP); metal complexes such as bis[2-(2-hydroxyphenyl)pyridinato] zinc (abbreviation: $Znpp_2$), and bis[2-(2-hydroxyphenyl)benzoxazolato] zinc (abbreviation: ZnBOX); and the like can be used. However, the material which is used for dispersing the light emitting material is not limited to these materials. By the light emitting layer 123 in which the light emitting material is dispersed, quenching of emission from the light emitting material due to concentration can be prevented.

Next, light emitting materials for the light emitting layer 123 will be mentioned. When red emission is desired to be obtained, 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidine-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl] benzene, and the like can be used. However, the material for obtaining red emission is not limited to these materials, and a material, which exhibits emission with a peak from 600 nm to 680 nm in an emission spectrum can be used.

When green emission is desired to be obtained, N,N'-dimethylquinacridone (abbreviation: DMQd), coumarin 6, coumarin 545T, tris(8-quinolinolato) aluminum (abbreviation: $Alq_3$), and the like can be used. However, the material for obtaining green emission is not limited to these materials, and a material which exhibits emission with a peak from 500 nm to 550 nm in an emission spectrum can be used.

In addition, when blue emission is desired to be obtained, 9,10-di(2-naphthyl)-2-tert-butylanthracene (abbreviation: t-BuDNA), 9,9'-bianthryl, 9,10-diphenylanthracene (abbreviation: DPA), 9,10-bis(2-naphthyl) anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), and the like can be used. However, the material for obtaining blue emission is not limited to these materials, and a material which exhibits emission with a peak from 420 nm to 500 nm in an emission spectrum can be used.

A light emitting device of full color display can be made by selecting such a light emitting material.

When white emission is desired to be obtained, for example, TPD (aromatic diamine), 3-(4-tert-butylphenyl)-4-phenyl-5-(4-biphenylyl)-1,2,4-triazole (abbreviation: TAZ), tris(8-quinolinolato) aluminum (abbreviation: $Alq_3$), $Alq_3$ doped with Nile Red, which is red luminescent pigment, and $Alq_3$ are sequentially stacked from the first electrode 101 side by a vapor deposition method or the like.

In addition, α-NPD, α-NPD doped with perylene, bis(2-methyl-8-quinolinolato)-4-phenylphenolate-aluminum (abbreviation: BAlq) doped with DCM1, and $Alq_3$ may be sequentially stacked from the first electrode 101 side by a vapor deposition method or the like.

In addition, white emission can be obtained by dispersing 2-(4-biphenylyl)-5-(4-tert-buthylphenyl)-1,3,4-oxadiazole (abbreviation: PBD) of 30 wt % as an electron transport agent into poly(N-vinylcarbazole) (abbreviation: PVK) and dispersing an adequate amount of four kinds of pigments (TPB, coumarin 6, DCM1, and Nile Red).

Even if a light emitting device which displays single color of any one of red, blue, green, and white is formed, desirable emission can be exhibited by a color filter, and further, full color display can be conducted.

As to the light emitting layer 123, a layer in which a metal oxide is mixed into an organic compound may be used. By using the mixed layer of an organic compound and a metal oxide, the second layer 112 can be thickly formed without increasing resistance.

Next, the electron transporting layer 124 is explained. The electron transporting layer 124 is a layer which has a function of transporting electrons injected from the second electrode 102 to the light emitting layer 123. By providing the electron transporting layer 124 in this way to further separate the second electrode 102 and the light emitting layer 123 from each other, quenching of emission due to metal can be prevented.

It is preferable that the electron transporting layer 124 be formed from a material in which the electron mobility is higher than the hole mobility. Further, it is more preferable that the electron transporting layer 124 be formed from a material which has the electron mobility of $10^{-6}$ $cm^2/Vs$ or more. In addition, the electron transporting layer 124 may be a layer which has a multilayer structure formed by combining two or more layers including the material described above. As a specific material for the electron transporting layer, a metal complex having a quinoline skeleton or a benzoquinoline skeleton, such as tris(8-quinolinolato) aluminum (abbreviation: $Alq_3$), tris(5-methyl-8-quinolinolato) aluminum (abbreviation: $Almq_3$), bis(10-hydroxybenzo[h]-quinolinato) beryllium (abbreviation: $BeBq_2$), or BAlq mentioned above, is preferred. In addition, a metal complex having an oxazole-based or triazole-based ligand, such as bis[2-(2-hydroxyphenyl)-benzoxazolato] zinc (abbreviation: Zn(BOX)2) or bis[2-(2-hydroxyphenyl)-benzothiazolato] zinc (abbreviation: $Zn(BTZ)_2$), can be used. Moreover, besides metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl] benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be also used.

This second layer 112 can be manufactured by a vapor deposition method whether the second layer 112 has a single-layer structure or a stacked-layer structure. When a mixed layer is formed for layers included in the second layer 112, a co-evaporation method can be used. The co-evaporation method includes a co-evaporation method by resistance-heating evaporation, a co-evaporation method by electron-beam evaporation, and a co-evaporation method by resistance-heating evaporation and electron-beam evaporation. In addition, the second layer 112 can be formed by combining the same type of methods or different types of methods, for example, deposition by resistance-heating evaporation and sputtering and deposition by electron-beam evaporation and sputtering. The example described above shows a layer including two kinds of materials. However, when three or more kinds of materials are included, the second layer 112 can be formed also in the same way by combining the same type of methods or different types of methods as described above.

Next, the third layer 113 which is a layer generating electrons is explained. As this third layer 113, for example, a layer including an electron transporting material and a material which exhibits an electron donating property to the electron transporting material can be cited.

It is to be noted that the electron transporting material is a material in which a transporting property of electrons is higher than that of holes, and for example, metal complexes such as tris(8-quinolinolato) aluminum (abbreviation: Alq$_3$), tris(4-methyl-8-quinolinolato) aluminum (abbreviation: Almq$_3$), bis(10-hydroxybenzo[h]-quinolinato) beryllium (abbreviation: BeBq$_2$), bis(2-methyl-8-quinolinolato)-4-phenylphenolato-aluminum (abbreviation: BAlq), bis[2-(2-hydroxyphenyl)benzoxazolato] zinc (abbreviation: Zn(BOX)$_2$), and bis[2-(2-hydroxyphenyl)benzothiazolato] zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl] benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and 4,4'-bis(5-methyl-benzoxazol-2-yl) stilbene (abbreviation: BzOs) can be used. In addition, the third layer 113 can be formed from an n-type semiconductor. However, the electron transporting material is not limited thereto.

Further, as to the material which exhibits an electron donating property to the electron transporting material, a material selected from an alkali metal or an alkaline earth metal, specifically, lithium (Li), calcium (Ca), natrium (Na), kalium (K), magnesium (Mg), or the like can be used.

Further, an oxide of the alkali metal, an oxide of the alkaline earth metal, a nitride of the alkali metal, a nitride of the alkaline earth metal, or the like can exhibit an electron donating property to the electron transporting material. As to a specific material, lithium oxide (Li$_2$O), calcium oxide (CaO), natrium oxide (Na$_2$O), kalium oxide (K$_2$O), magnesium oxide (MgO), and the like are given. As to a material which exhibits the similar effect, a nitride or a fluoride of the alkali metal, and a nitride or a fluoride of the alkaline earth metal are given, and specifically, lithium fluoride (LiF), cesium fluoride (CsF), calcium fluoride (CaF$_2$), and the like can be given. However, the material which exhibits an electron donating property to the electron transporting material is not limited thereto. It is preferable that the material which exhibits an electron donating property to the electron transporting material be included so that the molar ratio is 0.5 to 2 (=the material which exhibits an electron donating property to the electron transporting material/the electron transporting material) with respect to the electron transporting material.

Alternatively, the third layer 113 may be a layer formed from a material such as zinc oxide, zinc sulfide, zinc selenide, tin oxide, or titanium oxide.

Further, it is preferable that the third layer 113 include a mixed layer of the electron transporting material, which comprises an organic compound, and the material which exhibits an electron donating property to the electron transporting material. Crystallization of the organic compound which is used for the third layer 113 can be suppressed by using this mixed layer of the organic compound and the inorganic compound, and the third layer 113 can be thickly formed without increasing resistance. Further, a mixed layer of an organic compound and a material, which exhibits an electron donating property to the electron transporting material and which is formed from the above metal oxide, has high conductivity; therefore, a film can be thickened. Hence, even if there is a depression/projection due to dust, dirt, or the like over the substrate, the depression/projection hardly has impacts since the third layer 113 is thickly formed without increasing resistance. Therefore, failure, such as short circuit between the first electrode 101 and the second electrode 102 due to a depression/projection, can be prevented. Further, the first electrode 101 and the second layer 112 can be separated from each other by forming the third layer 113 thickly; therefore, quenching of emission due to metal can be prevented.

Further, as to the material which exhibits an electron donating property to the electron transporting material, a material selected from an alkali metal or an alkaline earth metal, specifically, an oxide of metal selected from lithium (Li), calcium (Ca), natrium (Na), kalium (K), magnesium (Mg), or the like is given. As a specific metal oxide, an oxide of the alkali metal or an oxide of the alkaline earth metal is given. Specifically, lithium oxide (Li$_2$O), calcium oxide (CaO), natrium oxide (Na$_2$O), kalium oxide (K$_2$O), magnesium oxide (MgO), and the like are given. As to a material which exhibits the similar effect, a nitride or a fluoride of the alkali metal, and a nitride or a fluoride of the alkaline earth metal are given, and specifically, lithium fluoride (LiF), cesium fluoride (CsF), calcium fluoride (CaF$_2$), and the like are given. In addition, an oxynitride of the metal may be used if the similar effect can be obtained.

This third layer 113 can be manufactured by a vapor deposition method. When a mixed layer is formed as the third layer 113, a co-evaporation method can be used. The co-evaporation method includes a co-evaporation method by resistance-heating evaporation, a co-evaporation method by electron-beam evaporation, and a co-evaporation method by resistance-heating evaporation and electron-beam evaporation. In addition, the third layer 113 can be formed by combining the same type of methods or different types of methods, for example, deposition by resistance-heating evaporation and sputtering and deposition by electron-beam evaporation and sputtering. The example described above shows a layer including two kinds of materials. However, when three or more kinds of materials are included, the third layer 113 can be formed also in the same way by combining the same type of methods or different types of methods as described above.

In the stacked layer type light emitting element, the third layer 113 provided between the light emitting layers also serves as a layer which prevents excitation energy from moving toward only any one of the light emitting layers. The third layer 113 is preferably a layer which has a higher ionization potential than that of a light emitting layer formed below the third layer 113 and which has a higher LUMO level than the LUMO level of a light emitting layer formed above the third layer 113.

Thus, the third layer 113 is preferably formed so as to have a film thickness of 1 to 30 nm.

In the stacked layer type light emitting element, each of the first layers 111 and the third layers 113 may comprise a bipolar material. A bipolar material is a substance in which a value of a ratio of mobility of one carrier, which is any of an electron and a hole to mobility of the other carrier, is 100 or less, preferably 10 or less, when mobility of one carrier and mobility of the other carrier are compared with each other. In particular, among bipolar materials, a material in which mobility of a hole and an electron is $1 \times 10^{-6}$ cm$^2$/Vs or more is preferably used. As the bipolar material, for example, 2,3-bis(4-diphenylaminophenyl) quinoxaline (abbreviation: TPAQn), 2,3-bis{4-[N-(1-naphthyl)-N-phenylamino]phenyl}-dibenzo[f,h] quinoxaline (abbreviation: NPADiBzQn), and the like are given. Further, each of the first layers 111 and the third layers 113 may comprises the same bipolar material.

It is to be noted that one feature of the present invention is that thicknesses of the first layers 111 in each light emitting element are odd multiples of quarter wavelength with a range of plus or minus 10% thereof so that luminous output efficiency is high, and the invention is not limited to the structure of the light emitting element shown in FIG. 3. For example, although FIG. 3 shows the structure provided with the electron transporting layer 124 formed in contact with the third layer 113, there may be a case where the electron transporting layer 124 is not included. In this case, the light emitting layer 123 is in contact with the third layer 113; therefore, a material for dispersing a light emitting material is preferably used for the light emitting layer 123. Similarly, there may be a case where the hole transporting layer 122 is not included.

In addition, a material which is capable of producing luminescence without being dispersed, such as $Alq_3$, can be used for the light emitting layer 123. Since $Alq_3$ or the like is a light emitting material which has a favorable carrier transporting property, a layer composed of only $Alq_3$ can serve as the light emitting layer 123 without being dispersed.

These first to third layers 111 to 113 can be formed by the same method such as a vapor deposition method, and can be therefore formed continuously without being exposed to the air. Impurity mixing into an interface and the like can be reduced by forming the first to third layers 111 to 113 continuously without being exposed to the air in this way.

Figure 4:
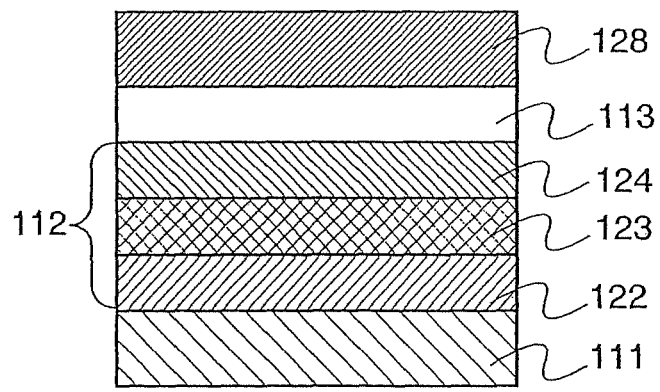
FIG. 4 is a view showing a light emitting element according to the invention.

FIG. 4 shows a structure which is different from that in FIG. 3.

As shown in FIG. 4, a light emitting element shown in this embodiment mode includes a first layer 111, a second layer 112, a third layer 113, and a fourth layer 128 which are sequentially stacked from a first electrode 101, and the structure has a feature of providing the fourth layer 128. The fourth layer 128 can be formed from a material which is the same as that of the first layer 111. Since another structure is described above, the explanation is omitted.

By thusly providing the fourth layer 128, damage to each layer when a second electrode 102 is formed can be reduced.

In a light emitting element in which light emitting units are stacked, the thicknesses of the first layers 111 in each light emitting element are differentiated so that luminous output efficiency is enhanced. In the case of differentiate thicknesses, a mixed layer of an organic compound and a metal oxide may be used for the fourth layer 128 in the same manner as the first layer 111. It is preferable that the mixed layer be used for the fourth layer 128 since, by using the mixed layer for the fourth layer 128, drive voltage does not rise even if a film is thickened. It is to be noted that a nitride or an oxynitride of metal may be used if an effect which is equivalent to a metal oxide can be obtained.

In addition, damage caused when the second electrode 102 is formed can be expected to be further reduced by thickening the fourth layer 128.

The invention can provide a light emitting device in which the mixed layer of an organic compound and a metal oxide is used for the first layer 111 and the fourth layer 128 in the light emitting element in which light emitting units are stacked, luminous output efficiency is enhanced by a thickness of the layer, and driving at low voltage can be achieved. Further, the light emitting layer 123 and the first electrode 101, or the light emitting layer 123 and the second electrode 102 can be separated from each other by forming the layers thickly; therefore, quenching of emission due to metal can be prevented. Furthermore, the light emitting element can be thickly formed; therefore, short circuit between electrodes can be prevented and mass productivity can be enhanced.

A light emitting device including a stacked layer type light emitting element having the above described layer can display an image which is clear and superior in image quality, and low power consumption can be attained.

(Embodiment Mode 5)

In this embodiment mode, a cross-sectional view of three pixels is explained with reference to FIG. 5, where a transistor (driving transistor), which controls current supply toward a light emitting element, is a p-type thin film transistor (TFT) 611 and light emitted from a light emitting element 603 is extracted from a second electrode 102 side (top emission type). In this embodiment mode, light emitting units 100R, 100G, and 100B which exhibit emission of R, G, and B, respectively, are stacked;

therefore, colors are mixed and light emitted from the light emitting element can be recognized as white light. Therefore, a mode that full color display is conducted by using color filters 612R, 612G, and 612B of each color, which are formed over an opposing substrate 610, is shown.

Besides, a light emitting element in which light emitting units are stacked and which exhibits white color has a structure in which a light emitting unit that exhibits red emission and a light emitting unit that exhibits bluish green emission are stacked. By mixing the colors, light emitted from the light emitting element can be recognized as white light.

Figure 5:
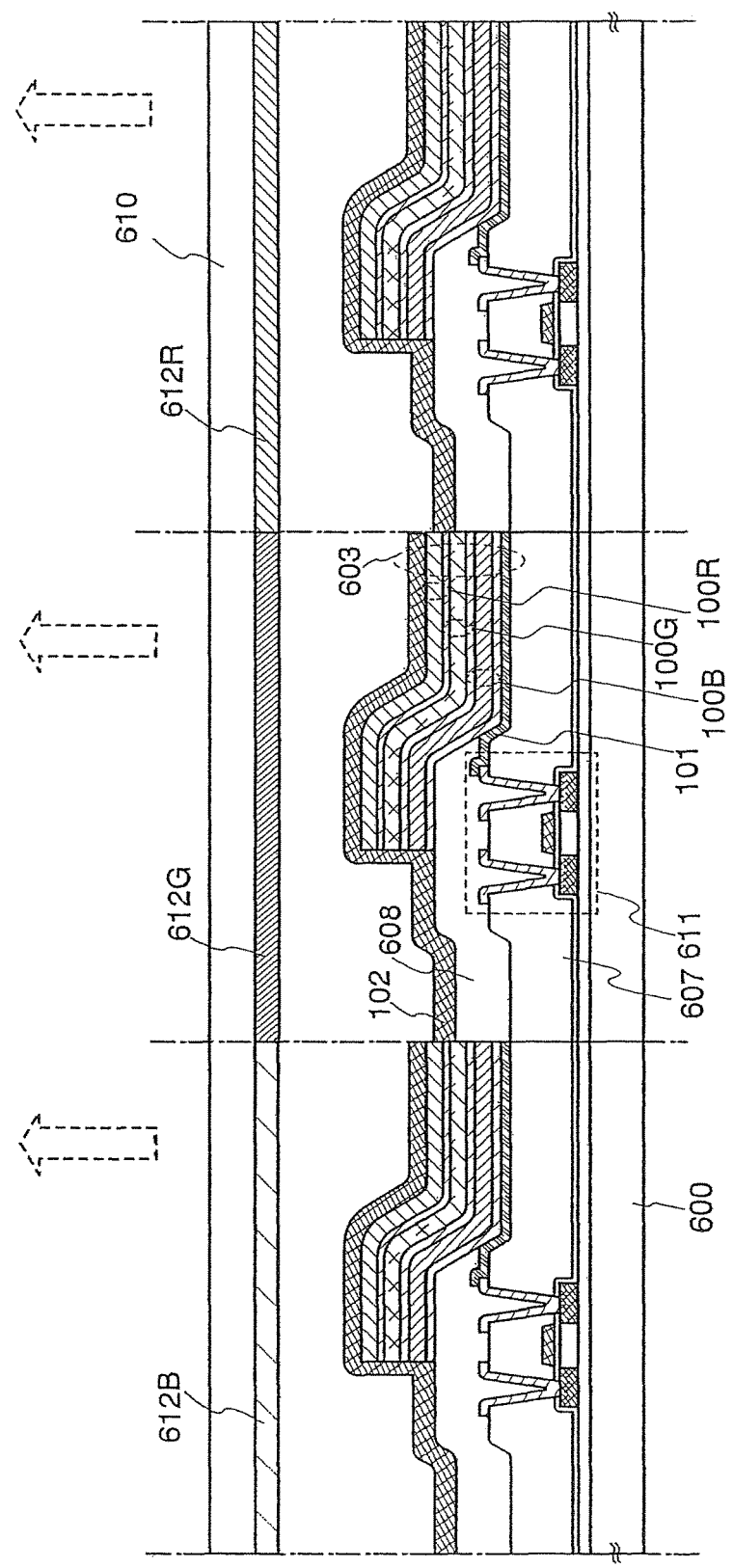
FIG. 5 is a view showing a light emitting device according to the invention.

In FIG. 5, a p-type TFT 611 is formed over a substrate 600 and a first electrode 101 and the TFT 611 are electrically connected. Further, light emitting units that exhibit emission of each of R, G, and B are stacked and a second electrode 102 is stacked over the first electrode 101. There is a case where the structure of a light emitting element includes first to third layers 111 to 113, as shown in the above embodiment mode and further includes a fourth layer 128.

The TFT 611 has a source region and a drain region added with an impurity element and a channel forming region formed in a separated island-shaped semiconductor film which is 10 to 200 nm in thickness. For the semiconductor film, any of an amorphous semiconductor film, a crystalline semiconductor film, and a microcrystalline semiconductor film may be used. For example, in the case of crystalline semiconductor film, a crystalline semiconductor film, which can be obtained by first forming an amorphous semiconductor film first and then conducting heat treatment, can be used. The heat treatment indicates treatment using a heating furnace, laser irradiation, irradiation with light emitted from a lamp (hereinafter, referred to as lamp annealing) instead of laser light, or a combination thereof. In the case of using laser irradiation, a continuous-wave laser (CW laser) or a pulsed-oscillation laser (pulsed laser) can be used, and further, these lasers can be used by being combined. For example, a laser light of a continuous-wave fundamental wave and a laser light of a continuous-wave harmonic may be emitted, and alternatively, a laser light of a continuous-wave fundamental wave and a laser light of a pulsed-oscillation harmonic may be emitted. By emitting a plurality of laser lights, energy can be compensated.

Further, in the case of laser irradiation, an incidence angle of laser may be set to be θ (0°<θ<90°) with respect to the semiconductor film. As a result, laser interferometry can be prevented.

Alternatively, a pulsed laser may be used, which can obtain a continuously-grown crystal grain in a scanning direction by oscillating a laser light at a repetition rate, which can emit the next pulsed laser light during a period from melting the semiconductor film by laser light to solidifying the same. A pulsed beam that is emitted at a frequency with a lower limit can be used in such a way that the period of pulsed oscillation is shorter than the period from melting the semiconductor film to completing solidification thereof. The repetition rate of a pulsed beam which can be actually used is 10 MHz or more, and a frequency band much higher than a usually-used frequency band of several tens to several hundreds of Hz is used.

As another crystallization method by heat treatment, in the case of using a heating furnace, there is a method of heating an amorphous semiconductor film at 500 to 550° C. for 2 to 20 hours. In this case, the temperature is preferably controlled by multistep regulation in the 500 to 550° C. range so as to gradually get higher. Since hydrogen and the like in the semiconductor film are released in the initial heating step at a lower temperature, film roughness by crystallization can be reduced, and further, a dangling bond can be terminated. Moreover, it is preferable to provide a metal element that promotes crystallization, for example, Ni, on the amorphous semiconductor film since the heating temperature can be reduced. Even in the case of crystallization using this metal element, the semiconductor film may be heated to 600 to 950° C.

However, in the case of forming the metal element, there is fear that adverse effects are caused on electrical characteristics of a semiconductor element. Therefore, it is necessary to perform a gettering step for reducing or removing the metal element. For example, a step of capturing the metal element with an amorphous semiconductor film as a gettering sink may be conducted.

Further, the TFT 611 has a gate insulating film covering the semiconductor film and a gate electrode, and an insulating film containing hydrogen may be provided over the gate electrode. A dangling bond in a crystalline semiconductor film can be terminated by the hydrogen.

The TFT 611 has a single-drain structure including only higher-concentration impurity regions, the source region and the drain region. Alternatively, the TFT 611 may have an LDD (Lightly Doped Drain) structure including a lower-concentration impurity region and higher-concentration impurity regions. It is to be noted that the TFT 611 may have a GOLD (Gate Overlapped LDD) structure in which a lower-concentration impurity region is overlapped with a gate electrode.

The TFT 611 is covered with an interlayer insulating film 607, and an insulating film 608 with an opening is formed over the interlayer insulating film 607. In this embodiment mode, the invention is not limited to the structure having the interlayer insulating film 607 and the insulating film 608, and a structure having only the interlayer insulating film 607 may be employed. The interlayer insulating film 607 may be a single-layer structure or a stacked-layer structure, and can be formed from an inorganic material, an organic material, or a stacked-layer structure of an inorganic material and an organic material. When an organic material is used, planarity can be enhanced. As to the organic material, polyimide, acrylic, polyamide, polyimide amide, resist, or benzocyclobutene can be used. Further, siloxane or polysilazane may be used for the interlayer insulating film 607. Siloxane is an insulating film including a Si—O—Si bond formed by using a siloxane-based material as a starting material. Polysilazane is an insulating film formed by using a liquid material containing a polymer material having a bond of silicon (Si) and nitrogen (N) as a starting material. In this embodiment mode, a structure in which the interlayer insulating film 607 is formed from an inorganic material is shown.

The first electrode 101 is partly exposed in an opening portion of the insulating film 608, and a stacked layer type light emitting element, in which the first electrode 101, the light emitting units 100B, 100G, and 100R, and the second, electrode 102 are sequentially stacked in the opening, is formed.

In each of the light emitting units 100B, 100G, and 100R, a thickness of each first layer 111 is odd multiples of quarter wavelength with a range of plus or minus 10% thereof so that luminous output efficiency from each light emitting layer 123 is enhanced. In addition, a layer in which an organic compound and a metal oxide are mixed is used for the first layer 111 to prevent drive voltage from rising due to increase in thickness.

As described above, each light emitting unit includes the first layer 111 having a hole transporting material, the third layer 113 having an electron transporting material, and the like, in addition to the second layer 112 having the light emitting layer 123.

In this embodiment mode, the first electrode 101 is an anode and the first layer 111 having a hole transporting material, the second layer 112 having the light emitting layer 123, and the third layer 113 having an electron transporting material are sequentially stacked from the first electrode 101 since the TFT 611 is a p-channel type. Alternatively, when the TFT 611 is an n-type, the first electrode 101 is preferably a cathode, and the third layer 113 having an electron transporting material, the second layer 112 having the light emitting layer 123, and the first layer 111 having a hole transporting material are sequentially stacked from the first electrode 101.

In this embodiment mode, a top emission type is employed; therefore, the first electrode 101 has reflectivity (namely, non light-transmitting property) and the second electrode 102 is formed from a light-transmitting material. For these materials, it is possible to refer to the embodiment mode described above.

In the case of the pixel shown in FIG. 5, light emitted from the light emitting element 603 can be extracted from the second electrode 102 side as indicated by an arrow, and full color display can be conducted by the color filters 612R, 612G, and 612B.

According to the invention, white emission with a wide range, in which emission wavelengths of respective R, G, and B are added with one another, can be obtained compared with the light emitting element formed from a white color material having a single layer. Further, in a light emitting unit of each of R, G, and B, a thickness of the first layer 111 is odd multiples of quarter wavelength with a range of plus or minus 10% thereof so that luminous output efficiency is enhanced. Therefore, thicknesses of the first layers 111 are different from one another in accordance with each of R, G, and B, and a layer in which an organic compound and a metal oxide are mixed is preferably used for the first layer 111, which is required to be especially thickened. This is because drive voltage can be prevented from rising even if the thickness of the first layer is increased.

In this embodiment mode, the TFT 611 can be made to be an n-type. In this case, the third layer 113 having a hole transporting material, the second layer 112 having the light emitting layer 123, and the first layer 111 having a hole transporting material may be sequentially stacked from the first electrode 101 by making the first electrode 101 serve as a cathode.

(Embodiment Mode 6)

In this embodiment mode, a mode of conducting full color display by color filters 612R, 612G, and 612B of each color, which are formed below a substrate 600, is shown where a transistor 611 is a p-type and light emitted from a light emitting element 603 is extracted from, a first electrode 101 side (bottom emission type).

Figure 6:
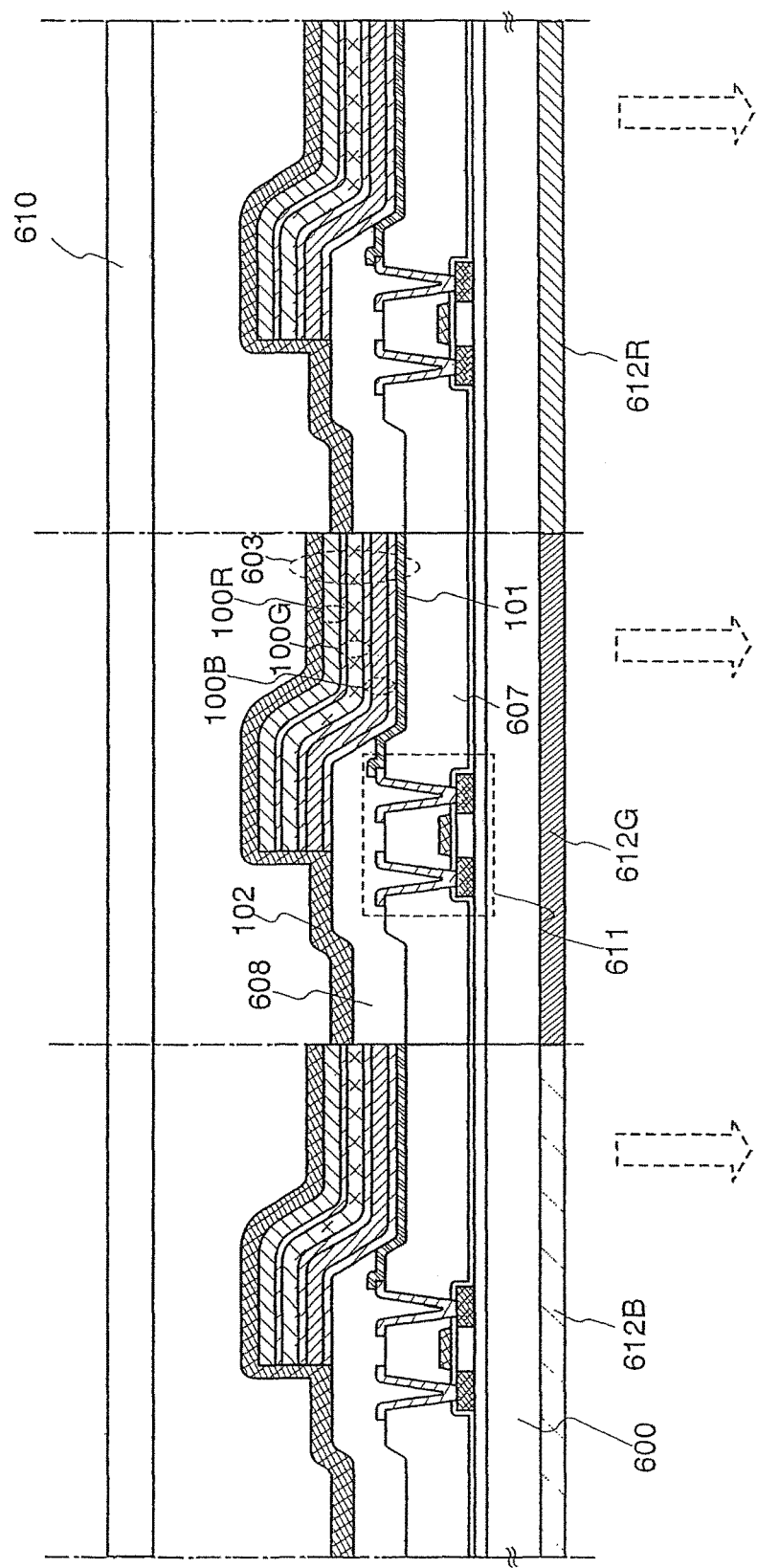
FIG. 6 is a view showing a light emitting device according to the invention.

In FIG. 6, a first electrode 101 of a light emitting element 603 and a TFT 611 are electrically connected. In addition, light emitting units 100B, 100G, and 100R and a second electrode 102 are stacked over the first electrode 101.

The TFT 611 can be formed in the same manner as in the above embodiment mode. Also in this embodiment mode, the invention is not limited to a structure having an interlayer insulating film 607 and an insulating film 608, and a structure having only an interlayer insulating film 607 may be employed. Further, since a bottom emission type is employed, the first electrode 101 has a light-transmitting property and the second electrode 102 has reflectivity. For these materials, it is possible to refer to the embodiment mode described above. Furthermore, color filters 612R, 612G, and 612B of each color are provided below the substrate 600 in the first electrode 101 side which is in a light emission side. It is to be noted that the color filters 612R, 612G, and 612B are not required to be provided below the substrate 600 and may be provided in a light emitting direction. For example, the color filters 612R, 612G, and 612B can be provided in the same layer as in the interlayer insulating film 607.

The light emitting element 603 in which light emitting units are stacked can be formed in the same manner as in the above embodiment mode. In other words, in each of the light emitting units 100B, 100G, and 100R, a thickness of each of the third layer 113 is odd multiples of quarter wavelength with a range of plus or minus 10% thereof so that luminous output efficiency from each light emitting layer 123 is enhanced. Further, a layer in which an organic compound and a metal oxide are mixed is used for a third layer 113 to prevent drive voltage from rising due to increase in thickness. As to a specific material in the third layer 113, lithium oxide ($Li_2O$), calcium oxide (CaO), natrium oxide ($Na_2O$), kalium oxide ($K_2O$), magnesium oxide (MgO), and the like are given. As to a material which exhibits the similar effect, a nitride or a fluoride of the alkali metal, and a nitride or a fluoride of the alkaline earth metal are given, and specifically, lithium fluoride (LiF), cesium fluoride (CsF), calcium fluoride ($CaF_2$), and the like can be given.

In the case of the pixel shown in FIG. 6, light emitted from the light emitting element 603 can be extracted from the first electrode 101 side as indicated by an arrow, and full color display can be conducted by the color filters 612R, 612G, and 612B.

According to the invention, white emission with a wide range in which emission wavelength of each of R, G, and B are added can be obtained compared with the light emitting element formed from a white color material having a single layer. Further, in a light emitting unit of each of R, G, and B, a thickness of the third layer 113 is odd multiples of quarter wavelength with a range of plus or minus 10% thereof so that luminous output efficiency is enhanced. Therefore, thicknesses of the third layers 113 are different from each other in accordance with each of R, G, and B, and a layer in which an organic compound and a metal oxide are mixed is preferably used for the third layer 113, which is required to be especially thickened. This is because drive voltage can be prevented from rising even if a thickness is increased.

In the case where the TFT 611 is an n-type in this embodiment mode, the first electrode 101 is made to serve as a cathode. Therefore, the first layer having an electron transporting material, the second layer having the light emitting layer, and the third layer having a hole transporting material may be sequentially stacked from the first electrode 101.

(Embodiment Mode 7)

In this embodiment mode, a case where full color display is conducted without using color filters by using light emitting materials, which exhibit each luminescent color for each of light emitting units 100R, 100G, and 100B, is explained.

Figure 7:
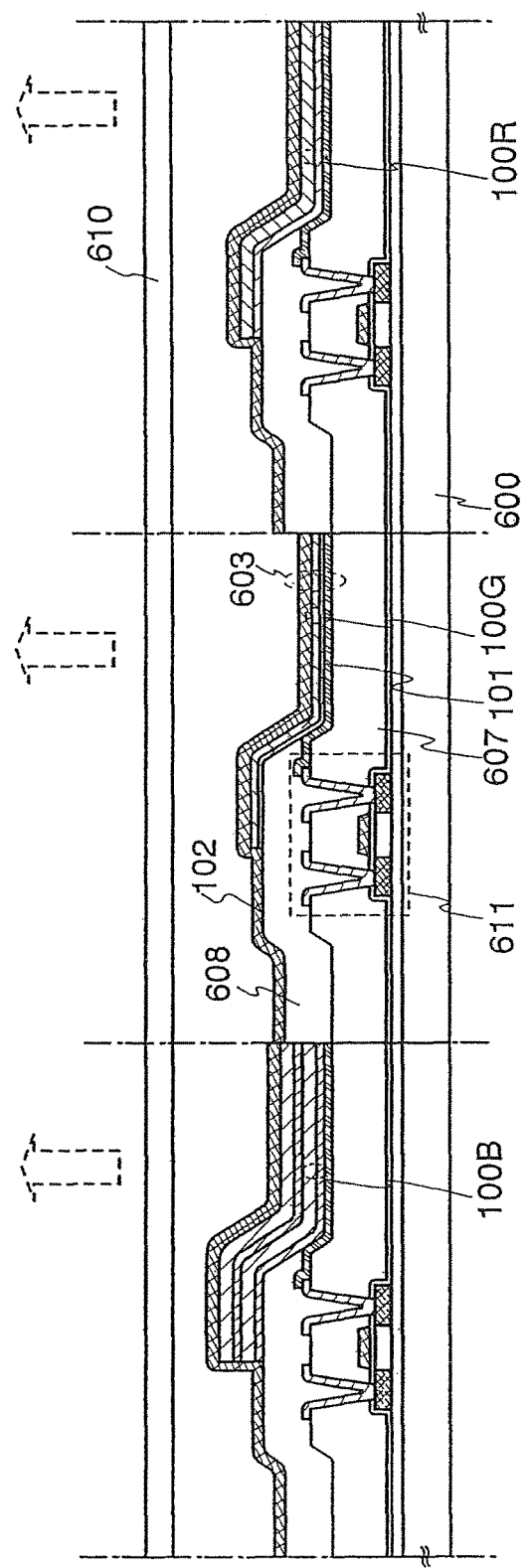
FIG. 7 is a view showing a light emitting device according to the invention.

A top emission type light emitting device shown in FIG. 7 is explained, in which a TFT 611 is a p-type and light emitted from a light emitting element 603 is extracted from a second electrode 102 side. The TFT 611 and each of light emitting elements 100R, 100G, and 100B are provided over a substrate 600. At this time, a stacked layer type light emitting element 100B is used for blue (B), and single-layer type light emitting elements 100R and 100B are used for red (R) and green (G), respectively. Then, a thickness of a first layer 111 of each light emitting element is odd. multiples of quarter wavelength with a range of plus or minus 10% thereof to enhance luminous output efficiency. In a stacked layer type light emitting element, a thickness of the first layer 111 is odd multiples of quarter wavelength with a range of plus or minus 10% thereof according to each light emitting element.

The blue light emitting element is stacked as described above since a light emitting element emitting blue color has low luminous efficiency compared with light emitting elements emitting other colors, therefore, having short life time. Since luminous efficiency is low, it is required to drive at high voltage, and accordingly, deterioration is easy to generate. By stacking the light emitting element, luminous efficiency at the same current density can be enhanced; therefore, density of current flow can be kept low and lifetime can be improved.

The structures of the TFT 611, an interlayer insulating film 607, and an insulating film 608 are the same as that in the above embodiment mode; therefore, the explanation is omitted. In this case, a first electrode 101 is formed from a material having reflectivity and the second electrode 102 is formed from a light-transmitting material.

Even if full color display is conducted as shown in FIG. 7, color filters 612R, 612G, and 612B may be provided over the substrate 600 or an opposing substrate 610 as shown in the above embodiment mode. The width of emission spectrum can be narrowed and a beautiful image can be provided using the color filter.

It is to be noted that the TFT 611 may be an n-type, and in that case, the first electrode 101 is preferably a cathode. Then, a third layer 113 having an electron transporting material, a second layer 112 having a light emitting layer 123, and the first layer 111 having a hole transporting material may be sequentially stacked from the first electrode 101.

The stacked layer type light emitting element may be used for a red (R) and green (G) light emitting elements other than blue (B). By stacking the light emitting element, luminous efficiency at the same current density can be enhanced; therefore, current density can be kept low and lifetime can be improved.

(Embodiment Mode 8)

In this embodiment mode, a mode of a module, which can be connected to an external circuit in a light emitting device sealed by an opposing substrate 610, is explained. In this embodiment mode, a structure that does not have an interlayer insulating film 607 and an insulating film 608, but only has an interlayer insulating film 607 is explained. The number of steps is reduced by employing the structure having only the interlayer insulating film 607; therefore, mass productivity can be enhanced.

Figure 8A:
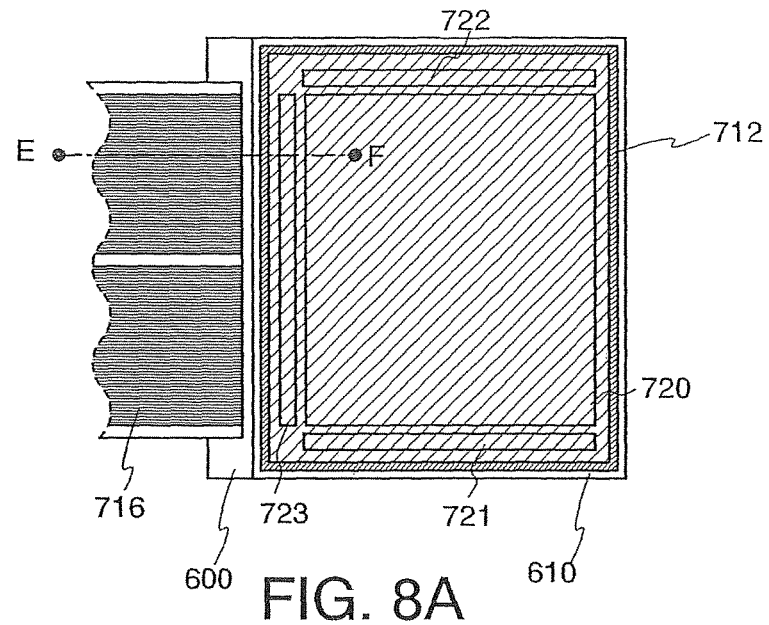
FIGS. 8A to 8C are views showing light emitting devices according to the invention.

FIG. 8A shows a light emitting device in which a pixel portion 720 over a substrate 600, a first scanning line driver circuit 721, a second scanning line driver circuit 722, and a signal line driver circuit 723 in the periphery of the pixel portion are integrated. The first scanning line driver circuit 721, the second scanning line driver circuit 722, and the signal line driver circuit 723 are connected to an external circuit respectively through a flexible printed circuit 716.

The light emitting device is sealed so that the light emitting element is not exposed to the air directly. In this embodiment mode, sealing is conducted by bonding the substrate 600 and the opposing substrate 610 to each other by a sealing material 712.

Figure 8B:
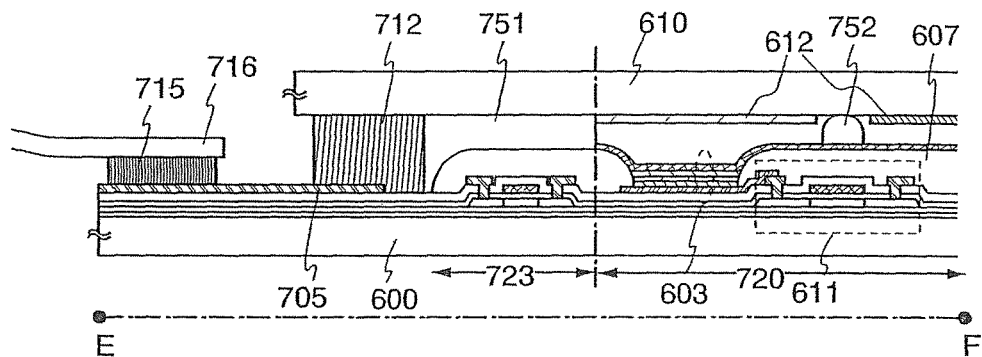

FIG. 8B shows a cross-sectional view of E-F in FIG. 8A. As shown in FIG. 8B, an inside 751 that is sealed is hollow, and the inside may be filled with gas, such as a nitrogen gas or an inert gas, or resin since intrusion of oxygen or moisture, which causes deterioration of a light emitting element, can be prevented. Further, a signal input from the external circuit is input from a connection wire 705 to the first scanning line driver circuit 721, the second scanning line driver circuit 722, and the signal line driver circuit 723 through the flexible printed circuit 716, and an emitting state or non-emitting state can be controlled according to each light emitting element by a signal from the driver circuit to be displayed as an image. The flexible printed circuit 716 and the connection wire 705 are connected to each other through an anisotropic conductive material 715.

Further, a spacer 752 is provided so as to keep a distance from the substrate 600 to the opposing substrate 610, which are bonded by the sealing material 712. Although the spacer 752 is provided over the interlayer insulating film 607 of TFT 611, the invention is not limited to this. In addition, the spacer 752 may be a columnar shape or a spherical shape.

In the case where a light emitting element 603 exhibits single color emission or emission of R, G, and B, a color filter 612 may be provided over the opposing substrate 610. The position of the color filter 612 may be a substrate 600 side, not an opposing substrate 610 side. A beautiful image can be provided using the color filter 612.

Figure 8C:
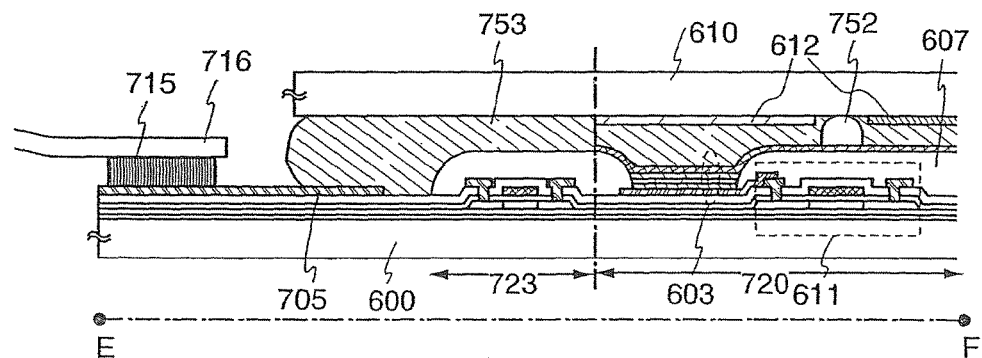

FIG. 8C also shows a cross-sectional view of E-F in FIG. 8A. FIG. 8C has a different structure from FIG. 8B, in which the substrate 600 and the opposing substrate 610 are bonded not by the sealing material 712 but by resin 753. By bonding the substrates by the resin 753, inferiority in forming the sealing material 712 can be eliminated. A drying agent may be added to the resin 753. In addition, resin 753 having a light-transmitting property may be used according to an emission direction.

In this embodiment mode, the first scanning line driver circuit 721, the second scanning line driver circuit 722, and the signal line driver circuit 723 may be mounted, by a TAB (Tape Automated Bonding) method, to the substrate being formed only at the pixel portion 720; the first scanning line driver circuit 721, the second scanning line driver circuit 722, and the signal line driver circuit 723 may be mounted by COG (Chip On Glass) method to the pixel portion 720 and the periphery thereof. Alternatively, the pixel portion 720, the first scanning line driver circuit 721, and the second scanning line driver circuit 722 may be integrated over the substrate 600, and the signal line driver circuit 723 may be separately mounted as an IC. The light emitting device according to the invention can obtain the effect in any mode of a driver circuit. Further, a TFT using a crystalline semiconductor film or a TFT using an amorphous semiconductor film may be used in a driver circuit. For example, the first scanning line driver circuit 721 and the second scanning line driver circuit 722 are not required to operate at high speed compared with the signal line driver circuit 723; therefore, a TFT using an amorphous semiconductor film can be used. A TFT using an amorphous semiconductor film can be also used for a part of the circuits, for example, a buffer circuit, even in the signal line driver circuit 723.

(Embodiment Mode 9)

In this embodiment mode, a mode of a light emitting device which is different from the above embodiment mode is illustrated. In this embodiment mode, a structure that does not have an interlayer insulating film 607 and an insulating film 608, but only has an interlayer insulating film 607 is explained. By employing the structure having only the interlayer insulating film 607, the number of steps is reduced; therefore, mass productivity can be enhanced.

Figure 15A:
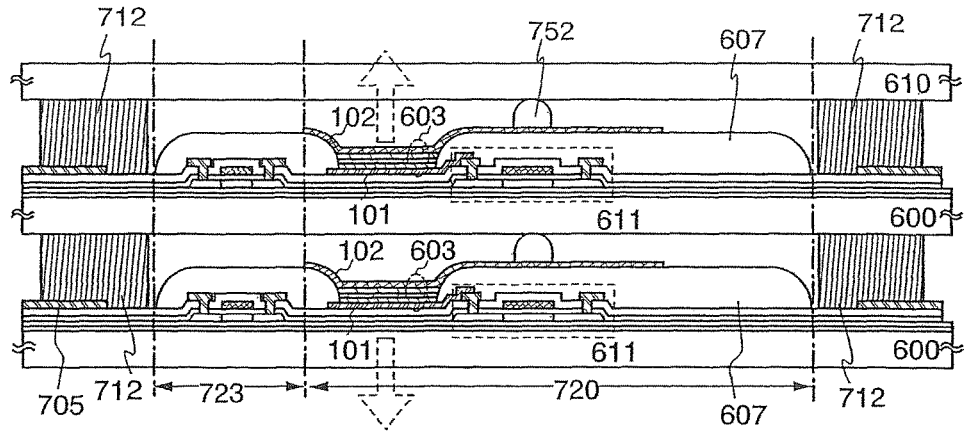
FIGS. 15A to 15C are views each showing a light emitting device according to the invention.

FIG. 15A shows a mode in which a top emission type light emitting device shown in FIG. 5 and a bottom emission type light emitting device shown in FIG. 6 are bonded to each other to be one light emitting device. In this case, a substrate 600 of the top emission type light emitting device can be used as an opposing substrate of the bottom emission type light emitting device.

For example, the formation up to a light emitting element 603 is conducted in the bottom emission type light emitting device. Then, a top emission type light emitting device and the bottom emission type light emitting device are bonded to each other by a sealing material 712. At this time, a top emission type light emitting device may be in a state where the opposing substrate 610 is pasted.

In the same manner as in the above embodiment mode, a space produced by the bonding may be filled with gas, such as a nitrogen gas or an inert gas, or resin. For example, an epoxy resin can be used as the resin. An epoxy resin has adhesiveness; therefore, adhesive strength can be enhanced.

Figure 15B:
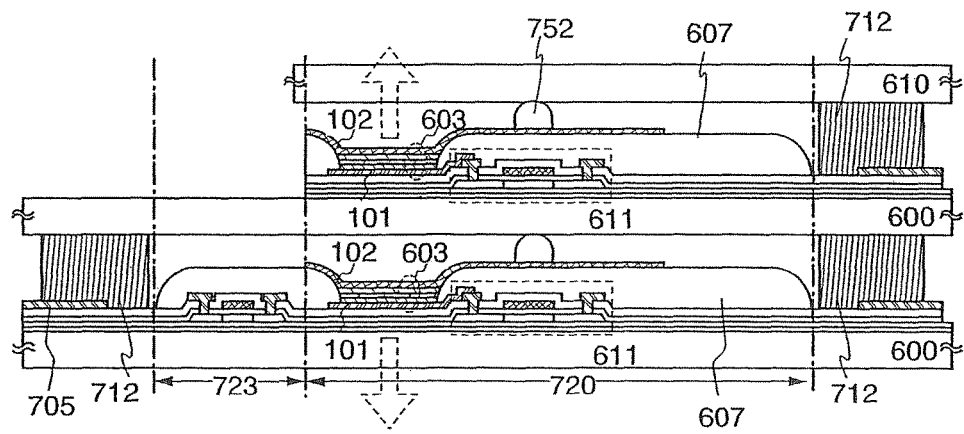

FIG. 15B shows a mode in which a top emission type light emitting device shown in FIG. 5 and a bottom emission type light emitting device shown in FIG. 6 are bonded to each other to be one light emitting device and in which a scanning line driver circuit or a signal line driver circuit 723 is shared. Sharing a scanning line driver circuit or a signal line driver circuit 723 means that wirings formation is conducted so that a signal is supplied from a scanning line driver circuit or a signal line driver circuit 723 provided over the substrate 600 of one light emitting device to a light emitting element 603 provided over another light emitting device. Therefore, another light emitting device can be bonded in a state where only a pixel portion 720 is provided over the substrate 600.

In the same manner as in the above embodiment mode, a space produced by the bonding may be filled with a nitrogen gas or an inert gas, or resin. For example, an epoxy resin can be used as the resin. An epoxy resin has adhesiveness; therefore, adhesive strength can be enhanced.

In addition, a light emitting device which can be applied to the invention is not limited to light emitting devices having different emission directions such as a top emission type light emitting device and a bottom emission type light emitting device, and light emitting devices having the same emission directions may be bonded to each other. For example, bottom emission type light emitting devices shown in FIG. 6 can be bonded to each other to be one light emitting device. In this case, the emission direction is the same; therefore, bottom emission type light emitting devices are arranged so as to face each other, and bonded to each other by a sealing material 712 to emit light to outside direction. Similarly, top emission type light emitting devices shown in FIG. 5 can be bonded to each other to be one light emitting device. In this case, the substrates 600 may be bonded to each other to emit light to the outside direction.

Figure 15C:
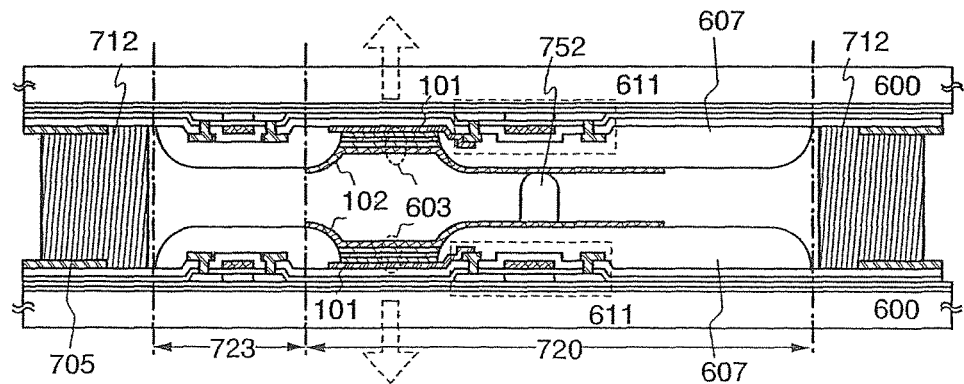

In the case of bonding bottom emission type light emitting devices so as to face each other, the bonding can be conducted without providing the opposing substrate 610 as shown in FIG. 15C. As a result, thinning of a light emitting device can be achieved. For example, the formation up to a light emitting element 603 is conducted in two bottom emission type light emitting devices. Then, the bottom emission type light emitting devices are bonded to each other by a sealing material 712. Obviously, the opposing substrate 610 may be shared, and the bonding may be conducted in a state where the opposing substrate 610 is pasted in each bottom emission type light emitting device.

In the same manner as in the above embodiment mode, a space produced by the bonding may be filled with a nitrogen gas or an inert gas, or resin. For example, an epoxy resin can be used as the resin. An epoxy resin has adhesiveness; therefore, adhesive strength can be enhanced.

This embodiment mode can be freely combined with the above embodiment modes. For example, a structure in which sealing is conducted by resin 753 without using the sealing material shown in FIG. 8C can be employed for the light emitting device shown in this embodiment mode.

By using the light emitting device, a display device with high added value can be attained and new application can be provided.

(Embodiment Mode 10)

In this embodiment mode, an equivalent circuit diagram of a pixel included in a light emitting device is explained with reference to FIGS. 9A to 9D.

Figure 9A:
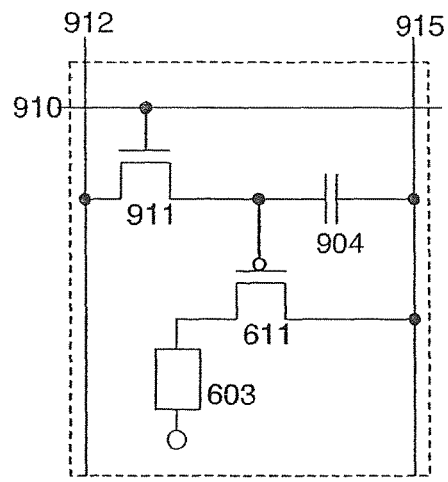
FIGS. 9A to 9D are diagrams each showing a pixel circuit of a light emitting device according to the invention.

FIG. 9A shows an example of an equivalent circuit of a pixel, which includes a signal line 912, a power supply line 915, a scanning line 910, a light emitting element 603, transistors 611 and 911, and a capacitor element 904. A TFT can be applied to the transistor.

In this equivalent circuit, a video signal is input from a signal line driver circuit to the signal line 912. The transistor 911 is able to control supply of the electric potential of the video signal to a gate of the transistor 611 in accordance with a selection signal that is input to the scanning line 910. The transistor 911 is referred to as a switching transistor. The transistor 611 is able to control supply of current to the light emitting element 603 in accordance with the electric potential of the video signal. The transistor 611 is referred to as a driving transistor. The light emitting element goes into an emitting state or non-emitting state in accordance with supplied current, which makes it possible to display images. The capacitor element 904 is able to hold voltage between the gate and source of the transistor 611.

Figure 9B:
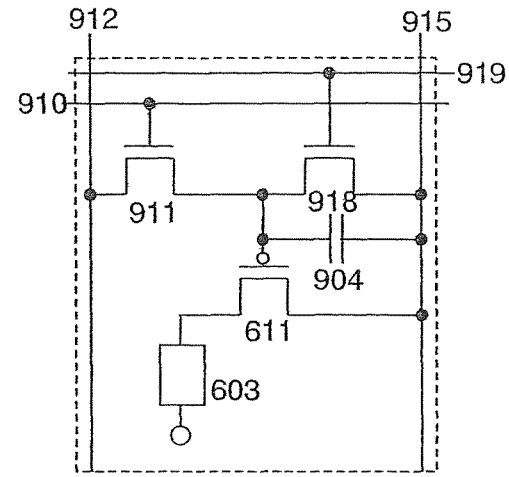

FIG. 9B is an equivalent circuit diagram of a pixel where a scanning line 919 and a transistor 918 are additionally provided to the equivalent circuit diagram of the pixel shown in FIG. 9A.

The transistor 918 makes it possible to make the electric potentials of the gate and source of the transistor 611 equal to each other so that a state where no current flows into the light emitting element 603 can be forcibly made. The transistor 918 is referred to as an erasing transistor. Therefore, in time gray-scale display, a video signal can be input before inputting video signals into all pixels, and the duty ratio can be thus made higher.

Figure 9C:
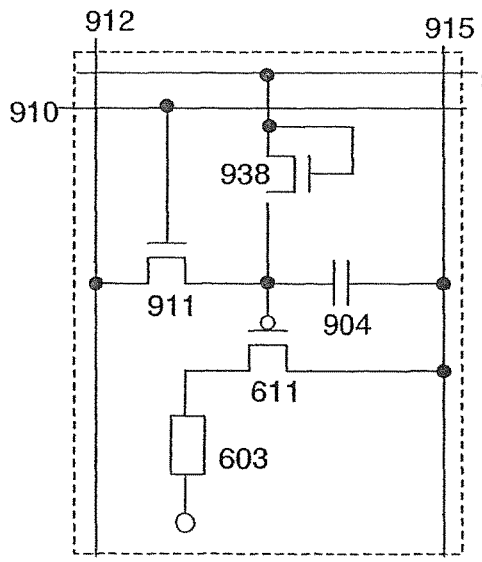

Alternatively, an element 938 which functions as a diode (diode element) may be provided instead of the erasing transistor 918 as shown in FIG. 9C. Then, a state where no current flows into the light emitting element 603 can be forcibly made in the same manner as a case of using the erasing transistor 918.

As an operation method, the scanning line 910 is selected to make the transistor 911 an ON state, and a signal is input from the signal line 912 to the capacitor element 904. Accordingly, current of the transistor 611 is controlled in accordance with the signal and current flows from the power supply line 915 to the light emitting element 603 to emit light. The voltage for making current flow to the light emitting element 603 corresponds to a drive voltage.

In the case of erasing a signal, the scanning line 919 is selected to make the diode element 938 be applied voltage so that gate voltage of the transistor 611 is made high. As a result, the driving transistor 611 is made to be an OFF state. Accordingly, current does not flow from the power supply line 915 to the light emitting element 603. Consequently, non-lighting period can be produced and the length of a lighting period can be freely controlled. Thus, the duty ratio can be made higher.

The diode element 938 is not limited and any elements with rectification can be used. The diode element may be a PN diode, a PIN diode, a Schottky diode, or a Zener diode, or a diode-junction (connection of a gate electrode and an electrode on higher electric potential side) transistor may be used. In FIG. 9C, an N-type transistor of diode-junction (connection of a gate electrode and a drain electrode) is used as the diode element 938. However, the invention is not limited to this, and a P-type transistor may be used. In the case of using the P-type transistor, the gate electrode and the source electrode are connected to each other.

Figure 9D:
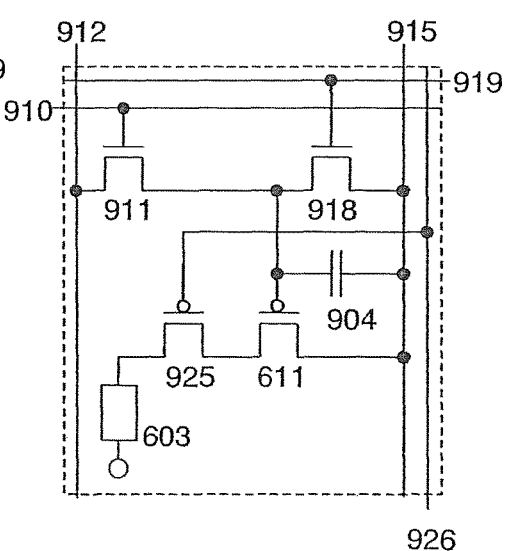

FIG. 9D is an equivalent circuit diagram of a pixel where a transistor 925 and a wiring 926 are additionally provided to the equivalent circuit diagram of the pixel shown in FIG. 9B. The gate of the transistor 925 has a fixed electric potential by the wiring 926. In addition, the transistors 611 and 925 are connected in series between the power supply line 915 and the light emitting element 603. Therefore, in FIG. 9D, the transistor 925 is able to control the value of current supplied to the light emitting element 603 whereas the transistor 611 is able to control whether or not the current is supplied to the light emitting element 603.

The equivalent circuits of the pixels shown in FIGS. 9A to 9D can be driven by a digital method. In the case of driving by a digital method, some variations in electrical characteristics of each driving transistor are negligible, if any, since the transistors are used as switching elements.

Figure 10:
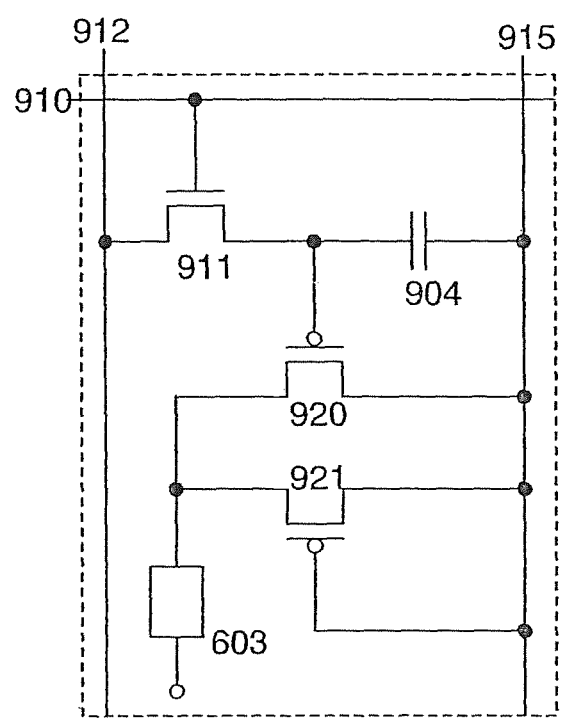
FIG. 10 is a diagram showing a pixel circuit of a light emitting device according to the invention.

An equivalent circuit of a pixel of a light emitting device according to the invention can be driven by either a digital method or an analog method. For example, an equivalent circuit of a pixel shown in FIG. 10 includes a signal line 912, a power supply line 915, a scanning line 910, a light emitting element 603, transistors 911, 920, and 921, and a capacitor element 904. In FIG. 10, the transistors 920 and 921, which are p-type transistors, form a current mirror circuit. In this equivalent circuit of a pixel and in the case of a digital method, a digital video signal is input from the signal line 912, and the value of current supplied to the light emitting element 603 is controlled in accordance with a time gray-scale. Alternatively, in the case of an analog method, an analog video signal is input from the signal line 912, and the value of current supplied to the light emitting element 603 is controlled in accordance with the value of the analog video signal. In the case of driving the equivalent circuit by the analog method, lower power consumption can be achieved.

In each pixel described above, signals are input to the signal line 912, the power supply lines 915 and wiring 926 from a signal line driver circuit. In addition, signals are input to the scanning lines 910 and 919 from a scanning line driver circuit. One or more signal line driver circuits and one or more scanning line driver circuits can be provided. For example, first and second scanning line driver circuits can be provided through a pixel portion.

In addition, in the pixel shown in FIG. 9A, a state where no current flows into the light emitting element 603 can be forcibly made as described with reference to FIG. 9B. For example, the transistor 911 is selected by a first scanning line driver circuit at the moment when the light emitting element 603 lights up, and a signal for forcibly applying no current into the light emitting element 603 is supplied to the scanning line 910 by a second scanning line driver circuit. The signal for forcibly applying no current (Write Erase Signal) is a signal for applying an electric potential so that first and second electrodes 101 and 102 of the light emitting element 603 have the same electric potential. In this way, a state where no current flows into the light emitting element 603 can be forcibly made, and the duty ratio can be thus made higher.

Although the capacitor element 904 is illustrated in FIGS. 9A to 9D and FIG. 10, it is not necessary that the capacitor element 904 be provided when the gate capacitance of the transistor or another parasitic capacitance is enough.

As described above, various types of equivalent circuits of a pixel of a light emitting device according to the invention can be employed.
(Embodiment Mode 11)

In this embodiment mode, a passive type light emitting device is explained, which is different from that in the above embodiment mode.

Figure 19:
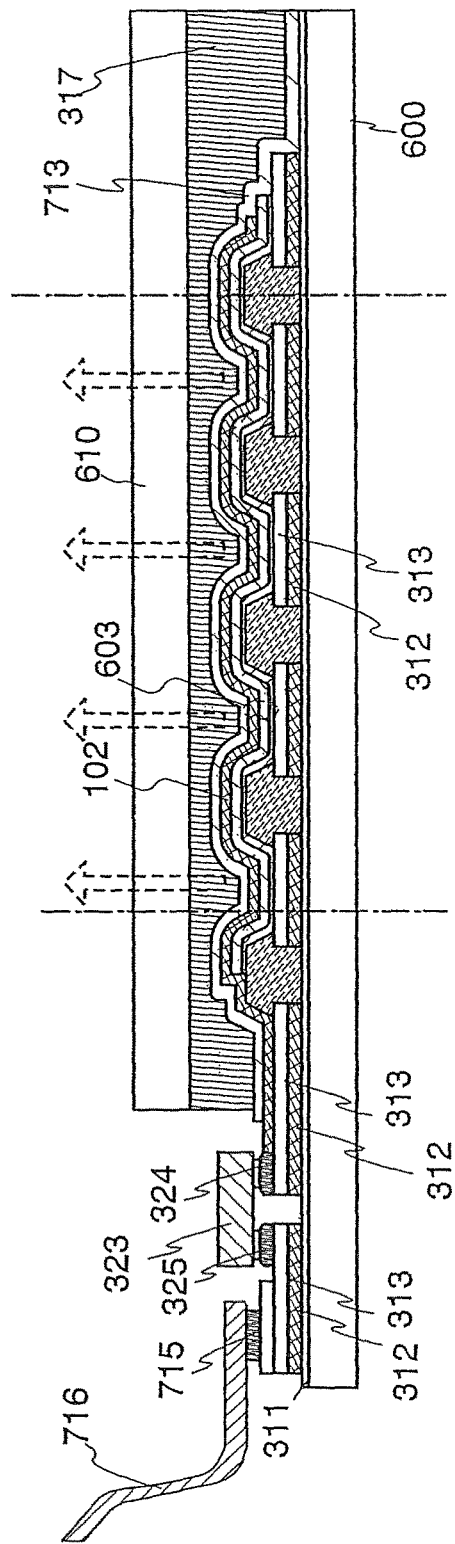
FIG. 19 is a view showing a light emitting device according to the invention.

As shown in FIG. 19, a base insulating film 311 is provided over a substrate 600, and a first conductor 312 and a second conductor 313 to be an electrode are stacked. Current is supplied to a light emitting element 603 by controlling the electrode, and accordingly, display can be conducted. The light emitting element 603 is arranged in matrix and two-dimensionally, which is included in a screen which displays an image.

A signal which controls an electrode is formed by an IC chip 323 that is connected through anisotropic conductive materials 324 and 325. In addition, an external signal or the like is input to the IC chip 323 through a flexible printed circuit 716 that is connected by an anisotropic conductive material 715.

The sealing of the light emitting element 603 is conducted by a passivation film 713, a sealing medium 317, and an opposing substrate 610. The passivation film 713 is formed of an insulating film that is difficult to penetrate water vapor, such as a silicon nitride film. The light transmittance of the silicon nitride film is slightly lowered in a near-ultraviolet region; therefore, a silicon nitride oxide film added with oxygen may be used to improve the light transmittance. In addition, aluminum nitride or aluminum nitride oxide may be applied to the passivation film 713. The opposing substrate 610 may be formed from metal, such as stainless steel or aluminum, glass, plastic, or the like. In the case where light of the light emitting element 603 is emitted from an opposing substrate 610 side, glass or plastic that transmits light is preferably used for the opposing substrate 610. Acrylic, polyethylene terephthalate (PET), or the like can be used for plastic, and a plate-like or film-like plastic can be used. In the case where plastic is used for the opposing substrate 610, a gas barrier film that shields water vapor or the like, or a hard coat film that increases the hardness of the surface, may be provided. The sealing medium 317 provided between the opposing substrate 610 and the passivation film 713 is formed from a resin material, such as an epoxy resin, a silicone resin, a phenol resin, or an urethane resin. The sealing medium 317 fixes the opposing substrate 610 and the substrate 600 and keeps a fixed distance from the opposing substrate 610 to the substrate 600. For that purpose, a silica particle or the like, which is to be a spacer, may be included in the sealing medium 317. According to this structure, intrusion of moisture or the like, which causes deterioration of the light emitting element 603, can be prevented.

Further, the light emitting element 603 is a stacked layer type light emitting element; therefore, luminous efficiency can be enhanced. Besides, a distance between a light emitting layer and a reflective electrode in each light emitting element is odd multiples of quarter wavelength with a range of plus or minus 10% thereof to enhance luminous output efficiency. Therefore, the amount of current which is applied can be kept low and the lifetime of the light emitting element can be improved.

The passive type light emitting device has a structure in which a semiconductor element is not provided at the intersecting portion of a scanning line and a signal line in a pixel portion; therefore, aperture ratio can be raised.

In addition, by providing color filters for the opposing substrate 610 or the like, full color display can be conducted.
(Embodiment Mode 12)

In this embodiment mode, a television receiver to which a light emitting device according to the invention is applied is explained.

Figure 11:
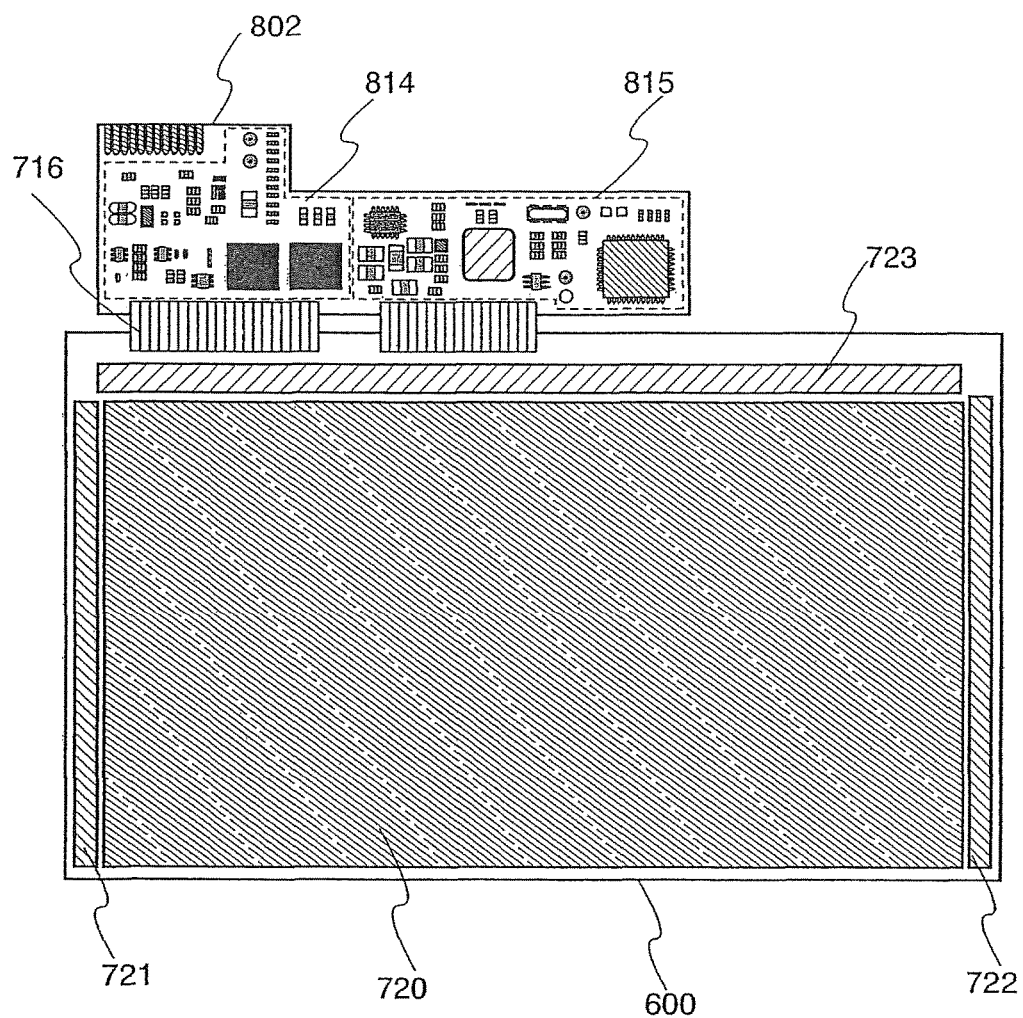
FIG. 11 is a view showing a television receiver according to the invention.

FIG. 11 shows a module in which a light emitting device according to the invention and a circuit board 802 are combined. The circuit board 802 is provided with, for example, a control circuit, a signal dividing circuit, and the like. The light emitting device is manufactured according to the above embodiment mode.

The light emitting devices includes a pixel portion 720 in which a light emitting element is provided in each pixel, first and second scanning line driver circuits 721 and 722, and a signal line driver circuit 723 supplying a video signal to a selected pixel. Further, a signal is sent from the circuit board 802 to the light emitting device through a flexible printed circuit 716. The circuit board 802 is provided with a control circuit 814 and a signal dividing circuit 815.

A high precision television receiver with low power consumption can be completed by mounting the light emitting device according to the invention.

Figure 12:
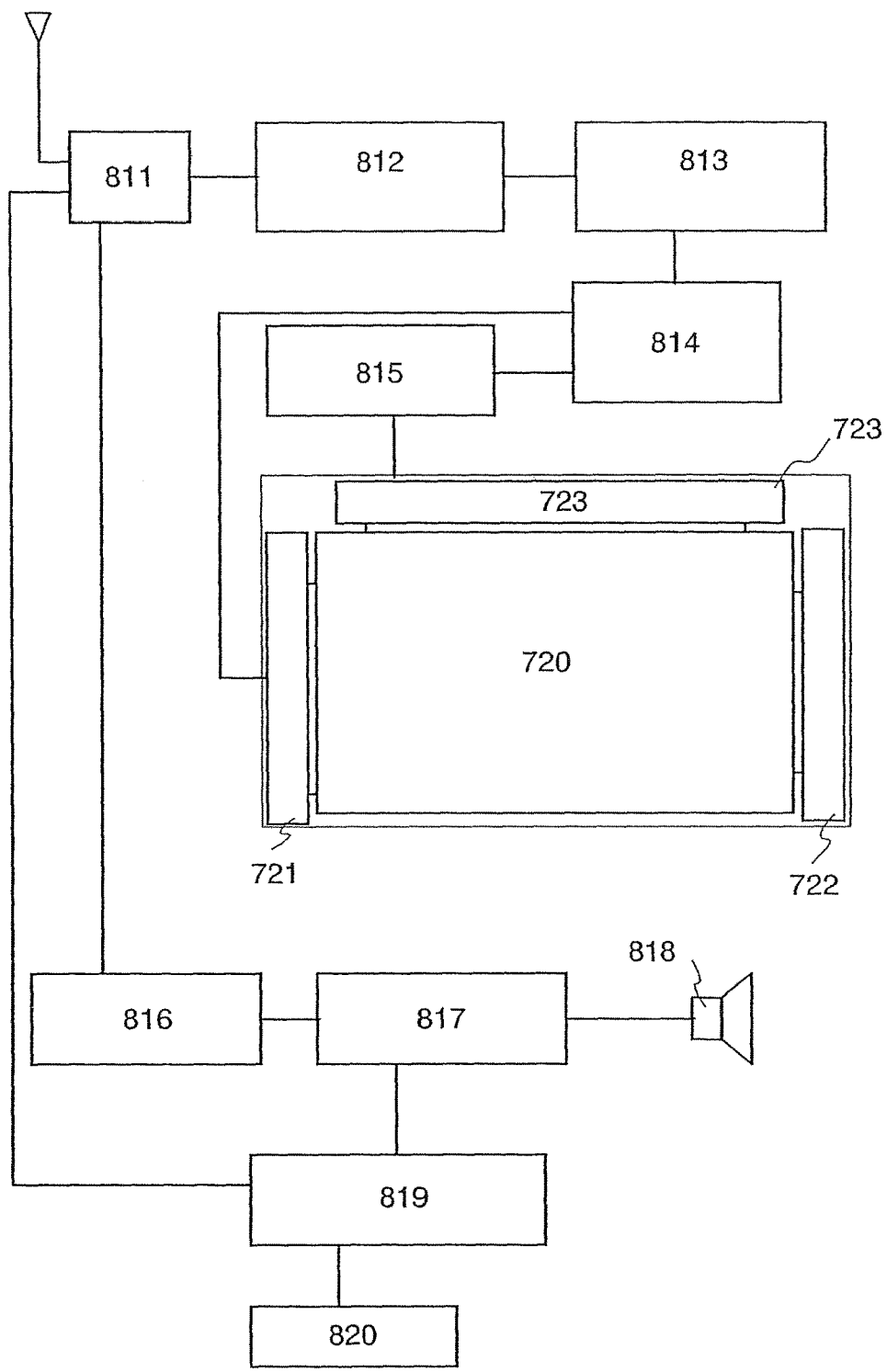
FIG. 12 is a diagram showing a system of a television receiver according to the invention.

FIG. 12 is a block diagram showing a principal structure of the television receiver. As shown in FIG. 12, a configuration of an external circuit formed in the circuit board 802 includes a video signal amplifier circuit 812 which amplifies a video signal among signals received in a tuner 811; a video signal processing circuit 813 which converts the signal output from the video signal amplifier circuit 812 into a color signal corresponding to each color of red, green, and blue; a control circuit 814 which converts the video signal into input signal of a driver IC; and the like on an input side of a video signal. A signal is output from the control circuit 814 to the first and second scanning line driver circuits 721 and 722 and the signal line driver circuit 723, respectively. In the case of conducting digital driving, a signal dividing circuit 815 is provided between the signal line driver circuit 723 and the control circuit 814 to have a structure in which an input digital signal is divided into m pieces and supplied.

An audio signal among signals received by the tuner 811 is sent to an audio signal amplifier circuit 816 and the audio signal is supplied to a speaker 818 through an audio signal processing circuit 817. A control circuit 819 receives control information on sound volume and a receiving station (receiving frequency) from an input portion 820, and a signal is sent to the tuner 811 and the audio signal processing circuit 817.

Figure 13:
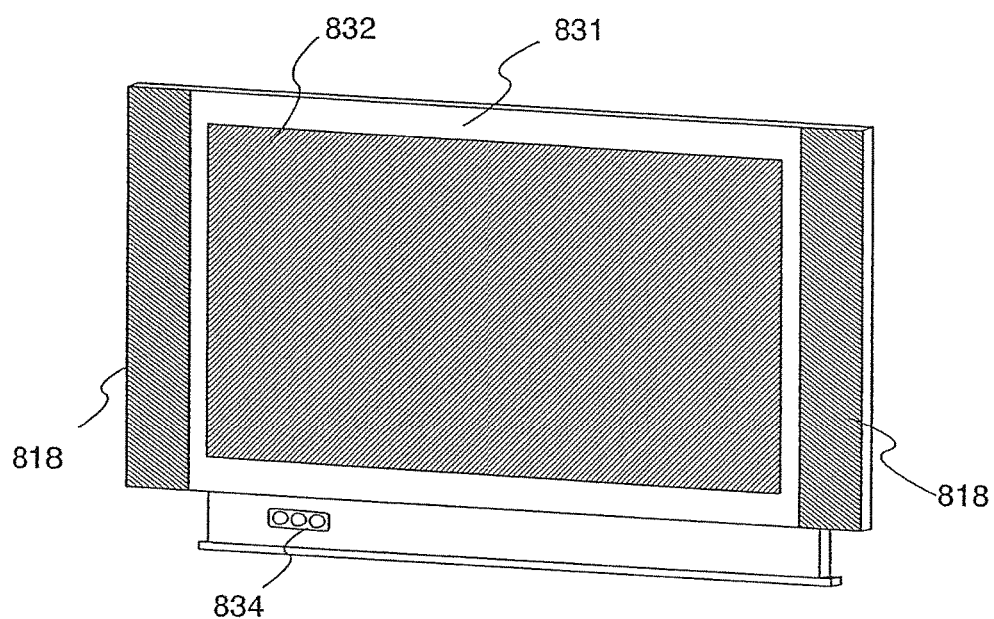
FIG. 13 is a diagram showing a television receiver according to the invention.

As shown in FIG. 13, a television receiver can be completed by incorporating the light emitting device mounted with the external circuit into a chassis 831. A display screen 832 is formed by using the light emitting device. In addition, as an accessory equipment, a speaker 818, operation switches 834, and the like are appropriately provided. Thus, a television receiver can be completed by applying the invention.

The television receiver can display an image which is clear and superior in image quality by including a light emitting device.

(Embodiment Mode 13)

An electronic device which is provided with a light emitting device according to the present invention in a display portion includes: a television receiver, a camera such as a digital camera or a digital video camera, a mobile phone set (simply referred to as a cellular phone set or a cellular phone), a portable information terminal such as a PDA, a portable game machine, a monitor for a computer, a computer, a sound reproducing device such as a car audio set, an image reproducing device provided with a recording medium such as a home game machine, and the like. Specific examples thereof will be described with reference to FIGS. 14A to 14E.

Figure 14A:
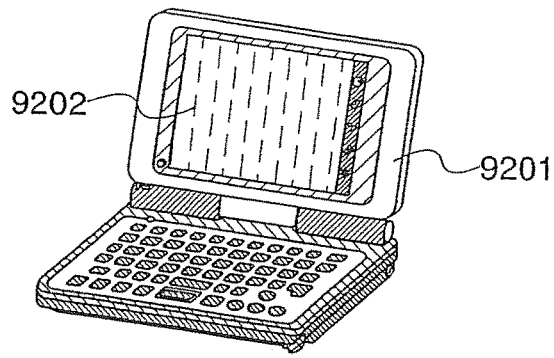
FIGS. 14A to 14E are views each showing an electronic device according to the invention.

A portable information terminal device shown in FIG. 14A includes a main body 9201, a display portion 9202, and the like. The light emitting device according to the invention can be applied to the display portion 9202. Accordingly, it is possible to provide a portable information terminal device that can display an image which is clear and superior in image quality and operates with low power consumption.

Figure 14B:
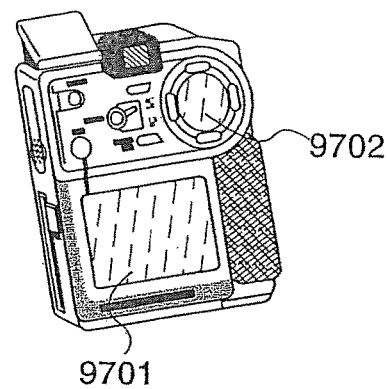

A digital video camera shown in FIG. 14B includes a display portion 9701, a display portion 9702, and, the like. The light emitting device according to the invention can be applied to the display portion 9701. Accordingly, it is possible to provide a digital video camera that can display an image which is clear and superior in image quality and operates with low power consumption.

Figure 14C:
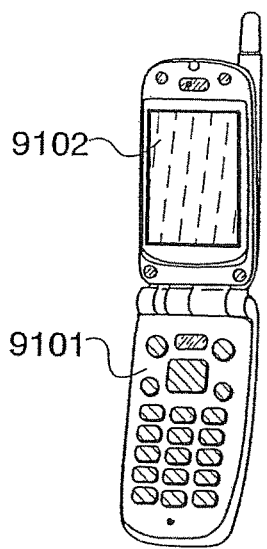

A cellular phone shown in FIG. 14C includes a main body 9101, a display portion 9102, and the like. The light emitting device according to the invention can be applied to the display portion 9102. Accordingly, it is possible to provide a cellular phone that can display an image which is clear and superior in image quality and operates with low power consumption.

Figure 14D:
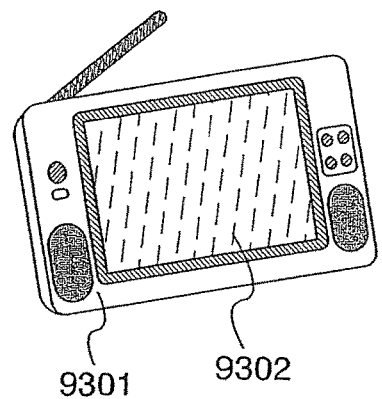

A portable television set shown in FIG. 14D includes a main body 9301, a display portion 9302, and the like. The light emitting device according to the invention can be applied to the display portion 9302. Accordingly, it is possible to provide a portable television set that can display an image which is clear and superior in image quality and operates with low power consumption. Further, the light emitting device according to the invention can be applied to various types of portable television sets such as a small-sized television incorporated in a portable terminal such as a cellular phone or a medium-sized television which is portable.

Figure 14E:
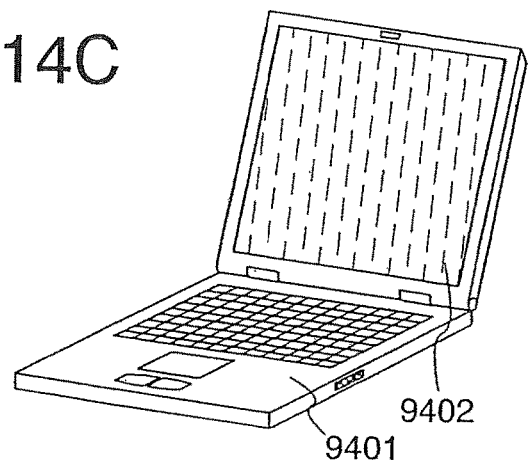

A portable computer shown in FIG. 14E includes a main body 9401, a display portion 9402, and the like. The light emitting device according to the invention can be applied to the display portion 9402. Accordingly, it is possible to provide a portable computer that can display an image which is clear and superior in image quality and operates with low power consumption.

The electronic device can display an image which is clear and superior in image quality and operates with low power consumption by including a light emitting device.

(Embodiment 1)

In this embodiment, an element structure in which a light emitting unit which exhibits blue, a light emitting unit which exhibits green, and a light emitting unit which exhibits red are sequentially stacked from a first electrode 101 is explained.

An electrode having high reflectivity and comprising aluminum is used for the first electrode 101, and an electrode having a high light-transmitting property and comprising indium tin oxide containing silicon oxide is used for a second electrode 102.

The light emitting unit that exhibits blue includes a first layer 111B that is formed from indium tin oxide containing silicon oxide; a second layer 112B that is formed of a layer in which an evaporated layer of α-NPD, an evaporated layer of t-BuDNA, and an evaporated layer of $Alq_3$ are sequentially stacked; and a third layer 113B that is formed of a co-evaporated layer of BzOs and Li. The light emitting unit that exhibits green uses a first layer 111G that is formed of a layer in which α-NPD and a molybdenum oxide are mixed (also referred to as a co-evaporated layer since the layer is formed by a co-evporation method); a second layer 112G that is formed of a layer in which an evaporated layer of α-NPD, a co-evaporated layer of $Alq_3$ and coumarin 6, and an evaporated layer of $Alq_3$ are sequentially stacked; and a third layer 113G that is formed of a co-evaporated layer of BzOs and Li. The mass ratio of $Alq_3$:coumarin 6 is set so as to be 1:0.005.

The light emitting unit that exhibits red includes a first layer 111R that is formed of a layer in which α-NPD and a molybdenum oxide are mixed using α-NPD as an organic compound (also referred to as a co-evaporated layer since the layer is formed by a co-evaporation method); a second layer 112R that is formed of a layer in which an evaporated layer of α-NPD and a co-evaporated layer of $Alq_3$, rubrene, and DCJTI are sequentially stacked; and a third layer 113R that is formed of a co-evaporated layer of BzOs and Li. The mass ratio of $Alq_3$:rubrene:DCJTI is set so as to be 1:1:0.02. Further, the mass ratio of BzOs:Li used for the third layer 113 of each light emitting element is set so as to be 1:0.01. Furthermore, the mass ratio of a molybdenum oxide:α-NPD used for the first layer 111 is set so as to be 1:0.25.

As described above, indium tin oxide containing silicon oxide can be applied to the first layer 111B for controlling a distance from a light emitting layer to the first electrode 101. In that case, a layer formed from a material which is superior in a hole injecting property such as DNTPD may be provided between the first layer 111B formed from indium tin oxide containing silicon oxide and the second layer 112B.

One feature of a light emitting element according to the embodiment is that, in a light emitting unit that exhibits green and a light emitting unit that exhibits red, a layer in which an organic compound typified by α-NPD and a molybdenum oxide are mixed is used for a layer for controlling a distance from a light emitting layer to a first electrode 101. It has been revealed that a drive, voltage does not rise even if the layer in which a molybdenum oxide and an organic compound are mixed is thickened. Therefore, the layer in which a molybdenum oxide and an organic compound are mixed is preferably used in a light emitting element with light emitting units that each exhibit green and red and that are stacked in order to control the distance from each light emitting layer (a layer formed from t-BuDNA, a layer formed from $Alq_3$ and coumarin 6, and a layer formed from $Alq_3$, rubrene, or DCJTI) to the first electrode 101 formed from aluminum since the film thickness can be large without increasing driving voltage.

(Embodiment 2)

An element structure is explained in this embodiment, in which a mixed layer of α-NPD and a molybdenum oxide is used for a first layer 111B for controlling a distance from a light emitting layer to a first electrode 101 instead of indium tin oxide containing silicon oxide. A light emitting unit which exhibits blue, a light emitting unit which exhibits green, and a light emitting unit which exhibits red are sequentially stacked from a first electrode 101 using the same material as in the above embodiment.

One feature of a light emitting element according to this embodiment is that a mixed layer of an organic compound typified by α-NPD and a molybdenum oxide is used for a layer for controlling the distance from the light emitting layer to the first electrode 101. It has been revealed that drive voltage does not rise even if the mixed layer of a molybdenum oxide and an organic compound is thickened. Therefore, the layer in which a molybdenum oxide and an organic compound are mixed is preferably used in all light emitting elements in which light emitting units are stacked in order to control the distance from each light emitting layer (a layer comprising t-BuDNA, a layer comprising $Alq_3$ and coumarin 6, and a layer comprising $Alq_3$, rubrene, and DCJTI) to the first electrode 101 formed from aluminum since of a film thickness can be large.

(Embodiment 3)

Figure 18A:
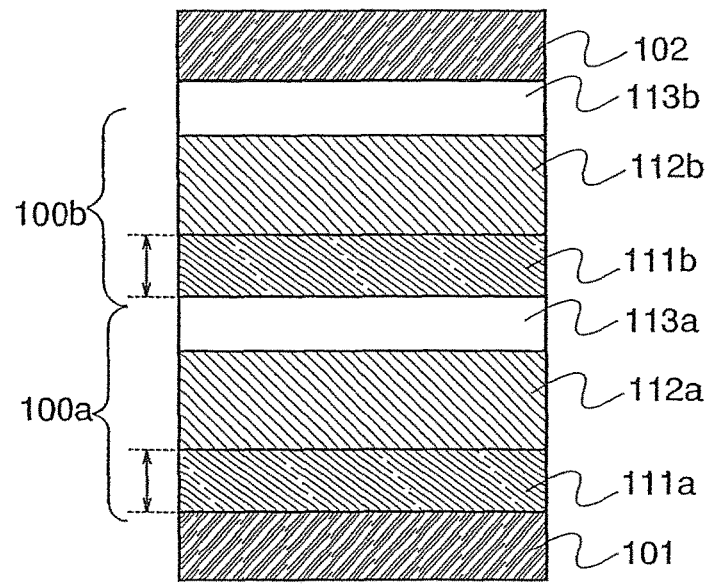
FIGS. 18A and 18B are views each showing a light emitting element according to the present embodiment.

In this embodiment, luminance is compared using a stacked layer type light emitting element and a single-layer type light emitting element according to the present invention by simulation. The stacked layer type light emitting element has a structure in which light emitting units 100a and 100b, which exhibit green, are stacked between a first electrode 101 and a second electrode 102 as shown in FIG. 18A. Each of the light emitting elements 100a and 100b that exhibit green has first layers 111a and 111b, second layers 112a and 112b, and third layers 113a and 113b. The first to third layers are formed from the same materials as in the above Embodiment 1. The first layer 111a is formed of a layer having indium tin oxide containing silicon oxide, and the first layer 111b is formed of a mixed layer of α-NPD and a molybdenum oxide. The first electrode 101 is formed from aluminum and the second electrode 102 is formed from indium tin oxide containing silicon oxide. Simulation is conducted under the following condition: the first electrode 101 is formed 100 nm thick. The first layer 111a is formed from a layer of indium tin oxide containing silicon oxide that is 40 nm thick, an evaporated layer of α-NPD that is 10 nm thick, a co-evaporated layer of $Alq_3$ and coumarin 6 that is 40 nm thick, and an evaporated layer of $Alq_3$ that is 20 nm thick. The second layers 112a and 112b of the three layers are formed of a co-evaporated layer of BzOs and Li that is 20 nm thick. To form third layers 113a and 113b, the first layer 111b in which α-NPD and a molybdenum oxide are mixed to form a 30 nm thick layer. The second electrode 102 is 110 nm thick.

Figure 18B:
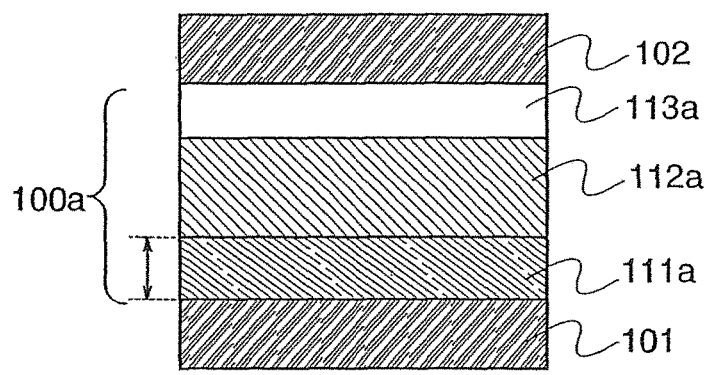

The single-layer type light emitting element has a structure including a light emitting unit 100a, which exhibits green between a first electrode 101 and a second electrode 102, as shown in FIG. 18B. The light emitting unit 100a, which exhibits green, has a first layer 111a, a second layer 112a, and a third layer 113a. The first to third layers are formed from the same materials as the elements shown in FIG. 18A, and the first layer 111a is formed of a layer having indium tin oxide containing silicon oxide.

Figure 16:
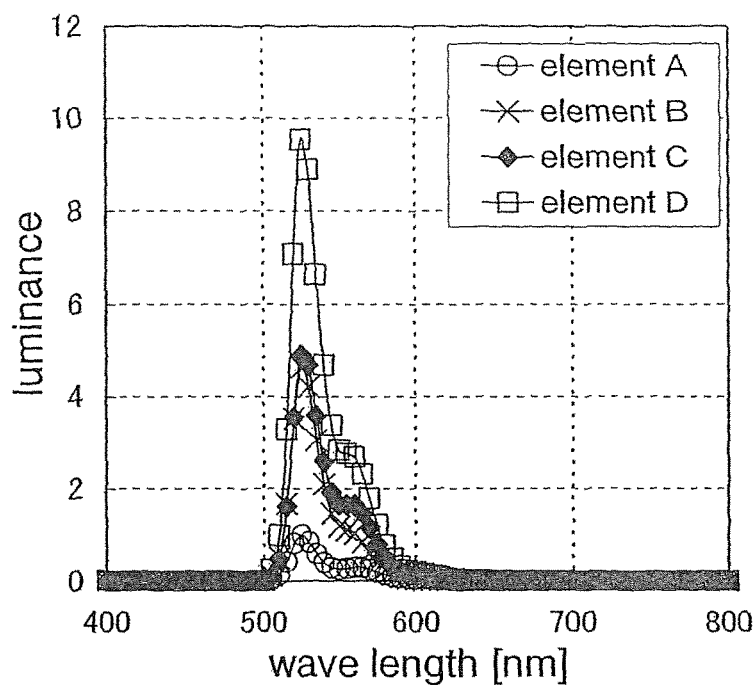
FIG. 16 is a graph showing luminance with respect to a wavelength of light emitting elements.

FIG. 16 is a graph of luminance with respect to a wavelength (nm) in the light emitting element shown in FIGS. 18A and 18B. An element A is a single-layer type light emitting element which is the light emitting element shown in FIG. 18B, in which the distance from the first electrode 101 to the light emitting layer is not odd multiples of quarter wavelength with a range of plus or minus 10% thereof by controlling a thickness of the first layer 111. An element B is a top side light emitting element of a stacked layer type light emitting element which is the light emitting element shown in FIG. 18A, in which the distance from the first electrode 101 to the light emitting layer is odd multiples of quarter wavelength with a range of plus or minus 10% thereof by controlling a thickness of the first layer 111. An element C is a bottom side light emitting element of a stacked layer type light emitting element which is the light emitting element shown in FIG. 18A, in which the distance from the first electrode 101 to the light emitting layer is odd multiples of quarter wavelength with a range of plus or minus 10% thereof by controlling a thickness of the first layer 111. An element D means a result of combining the luminance of the element B and the element C.

By comparing the element A with the element B or element C in FIG. 16, it is revealed that luminance is increased in the case where the distances from the first electrode 101 to the light emitting layers are odd multiples of quarter wavelength with a range of plus or minus 10% thereof by controlling a thickness of the first layer 111a having indium tin oxide containing silicon oxide and by the first layer 111B in which α-NPD and a molybdenum oxide are mixed in the stacked layer type light emitting element.

Figure 17:
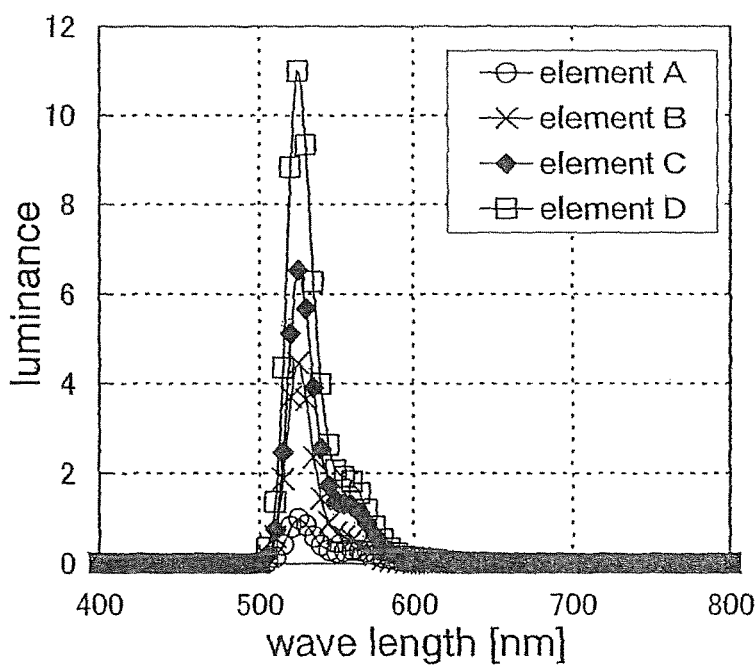
FIG. 17 is a graph showing luminance with respect to a wavelength of light emitting elements.

FIG. 17 is a graph of luminance with respect to a wavelength (nm), which is a result of conducting simulation using a mixed layer of α-NPD and a molybdenum oxide as the first layer 111a shown in FIGS. 18A and 18B. In other words, the conditions of the elements A to D are different from that of FIG. 16 in terms of having the first layer 111a formed of a mixed layer of α-NPD and a molybdenum oxide. The first layer 111a formed of a mixed layer of α-NPD and a molybdenum oxide in the element A has a film thickness of 35 nm. By comparing the element A with the element B or element C in FIG. 17, it is revealed that luminance is increased in the case where the distance from the first electrode 101 to the light emitting layer is odd multiples of quarter wavelength with a range of plus or minus 10% thereof by controlling a thickness of the first layers 111a and 111b in which α-NPD and a molybdenum oxide are mixed.

Further, by comparing FIG. 17 with FIG. 16, it is revealed that the light emitting element using the first layer 111a formed of a mixed layer of α-NPD and a molybdenum oxide has higher emission luminance. Furthermore, it is revealed that the first layer 111a in which α-NPD and a molybdenum oxide are mixed is preferable since the first layer 111a has higher conductivity than that of a layer having only α-NPD and drive voltage does not rise even if a film is thickened.

This application is based on Japanese Patent Application serial No. 2005-013688 field in Japan Patent Office on Jan. 21, 2005, the contents of which are hereby incorporated by reference.

The invention claimed is:

1. A light-emitting device comprising:
   a first electrode;
   a first mixed layer over and in contact with the first electrode, the first mixed layer comprising an organic compound and a metal oxide which exhibits an electron accepting property to the organic compound;
   a first light-emitting layer over the first mixed layer, the first light-emitting layer comprising a first light-emitting material;
   a second mixed layer over the first light-emitting layer, the second mixed layer comprising the organic compound and the metal oxide;
   a second light-emitting layer comprising over the second mixed layer, the second light-emitting layer comprising a second light-emitting material;
   a layer over the second light-emitting layer, the layer comprising a material which exhibits an electron donating property; and
   a second electrode over and in contact with the layer,
   wherein the second electrode is a reflective electrode.

2. The light-emitting device according to claim 1, wherein the metal oxide is molybdenum oxide.

3. The light-emitting device according to claim 1,
   wherein the first light-emitting layer comprises a first organic compound, and
   wherein the second light-emitting layer comprises a second organic compound which is different from the first organic compound.

4. The light-emitting device according to claim 1, wherein the material in the layer comprises an alkali metal or an alkaline earth metal.

5. The light-emitting device according to claim 1, wherein the first electrode is a light-transmitting electrode.

6. The light-emitting device according to claim 1, wherein a thickness of the first mixed layer is arranged so that an optical distance from the first light-emitting layer to the second electrode is odd multiples of quarter wavelength of emission color of the first light-emitting layer with a range of plus or minus 10% thereof.

7. The light-emitting device according to claim 1, wherein the light-emitting device emits white light.

8. An electronic device comprising the light-emitting device according to claim 1, wherein the electronic device is selected from a television receiver, a camera, a mobile phone set, a portable information terminal, a portable game machine, a monitor for a computer, a sound reproducing device, and an image reproducing device.

9. The light-emitting device according to claim 1, further comprising:
   a first substrate;
   a first light-emitting element, a second light-emitting element, and a third light-emitting element over the first substrate;
   a red color filter provided in a light emitting direction;
   a green color filter provided in the light emitting direction; and
   a blue color filter provided in the light emitting direction,
      wherein the first light-emitting layer and the second light-emitting layer are different in emission color from each other.

10. The light-emitting device according to claim 9, further comprising:
   an interlayer insulating film between the first substrate and the first electrode,
   wherein the red color filter, the green color filter, and the blue color filter are in the interlayer insulating film.

* * * * *